(12) United States Patent
Huang et al.

(10) Patent No.: US 12,002,807 B2
(45) Date of Patent: Jun. 4, 2024

(54) SEMICONDUCTOR STRUCTURE

(71) Applicant: TAIWAN SEMICONDUCTOR MANUFACTURING COMPANY LTD., Hsinchu (TW)

(72) Inventors: Jing-Jung Huang, Hsinchu (TW); Ching En Chen, Hsinchu (TW); Jung-Hui Kao, Hsinchu (TW); Kong-Beng Thei, Hsinchu Country (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/844,081

(22) Filed: Jun. 20, 2022

(65) Prior Publication Data
US 2022/0320082 A1    Oct. 6, 2022

Related U.S. Application Data

(62) Division of application No. 16/837,904, filed on Apr. 1, 2020, now Pat. No. 11,367,721.

(51) Int. Cl.
*H01L 27/088* (2006.01)
*H01L 21/762* (2006.01)
(Continued)

(52) U.S. Cl.
CPC ...... *H01L 27/088* (2013.01); *H01L 21/76224* (2013.01); *H01L 21/823481* (2013.01);
(Continued)

(58) Field of Classification Search
CPC . H01L 27/088; H01L 29/78; H01L 21/76224; H01L 21/823481; H01L 29/0653; H01L 29/66681; H01L 29/7816; H01L 29/42376; H01L 29/42368; H01L 29/42364; H01L 21/823462; H01L 21/76229; H01L 21/76202; H01L 21/823857; H01L 29/66689; H01L 29/66659; H01L 29/7835; H01L 27/0922; H01L 29/42356; H01L 29/66568; H01L 21/823493; H01L 29/66886; H01L 29/6625; H01L 29/41758; H01L 29/66674; H01L 29/7801; H01L 29/6653; H01L 29/6656
See application file for complete search history.

(56) References Cited

U.S. PATENT DOCUMENTS 7,575,977 B2 * 8/2009 Levin ............... H01L 21/823828
                                                       438/286
2007/0054464 A1 * 3/2007 Zhang ................ H01L 29/7835
                                                       257/E21.628
(Continued)

*Primary Examiner* — Sonya McCall-Shepard
(74) *Attorney, Agent, or Firm* — WPAT LAW; Anthony King

(57) ABSTRACT

A semiconductor structure includes a substrate including a first region and a second region; a first device disposed in the first region and a second device disposed in the second region; a first isolation disposed in the first region, wherein the first isolation is between a first source and a first drain, a first spacer overlaps the first isolation, the first isolation is separated from the first spacer by a first gate dielectric.

20 Claims, 18 Drawing Sheets

(51) Int. Cl.
  *H01L 21/8234* (2006.01)
  *H01L 29/06* (2006.01)
  *H01L 29/423* (2006.01)
  *H01L 29/66* (2006.01)
  *H01L 29/78* (2006.01)

(52) U.S. Cl.
  CPC .... *H01L 29/0653* (2013.01); *H01L 29/42364* (2013.01); *H01L 29/42376* (2013.01); *H01L 29/66681* (2013.01); *H01L 29/7816* (2013.01)

(56) References Cited

U.S. PATENT DOCUMENTS

| | | | | |
|---|---|---|---|---|
| 2010/0102388 | A1* | 4/2010 | Levin | H01L 21/823814 |
| | | | | 257/E29.256 |
| 2015/0364598 | A1* | 12/2015 | Jung | H01L 29/66659 |
| | | | | 438/286 |
| 2016/0064487 | A1* | 3/2016 | Park | H01L 21/761 |
| | | | | 257/343 |
| 2019/0259751 | A1* | 8/2019 | Pala | H01L 29/402 |

* cited by examiner

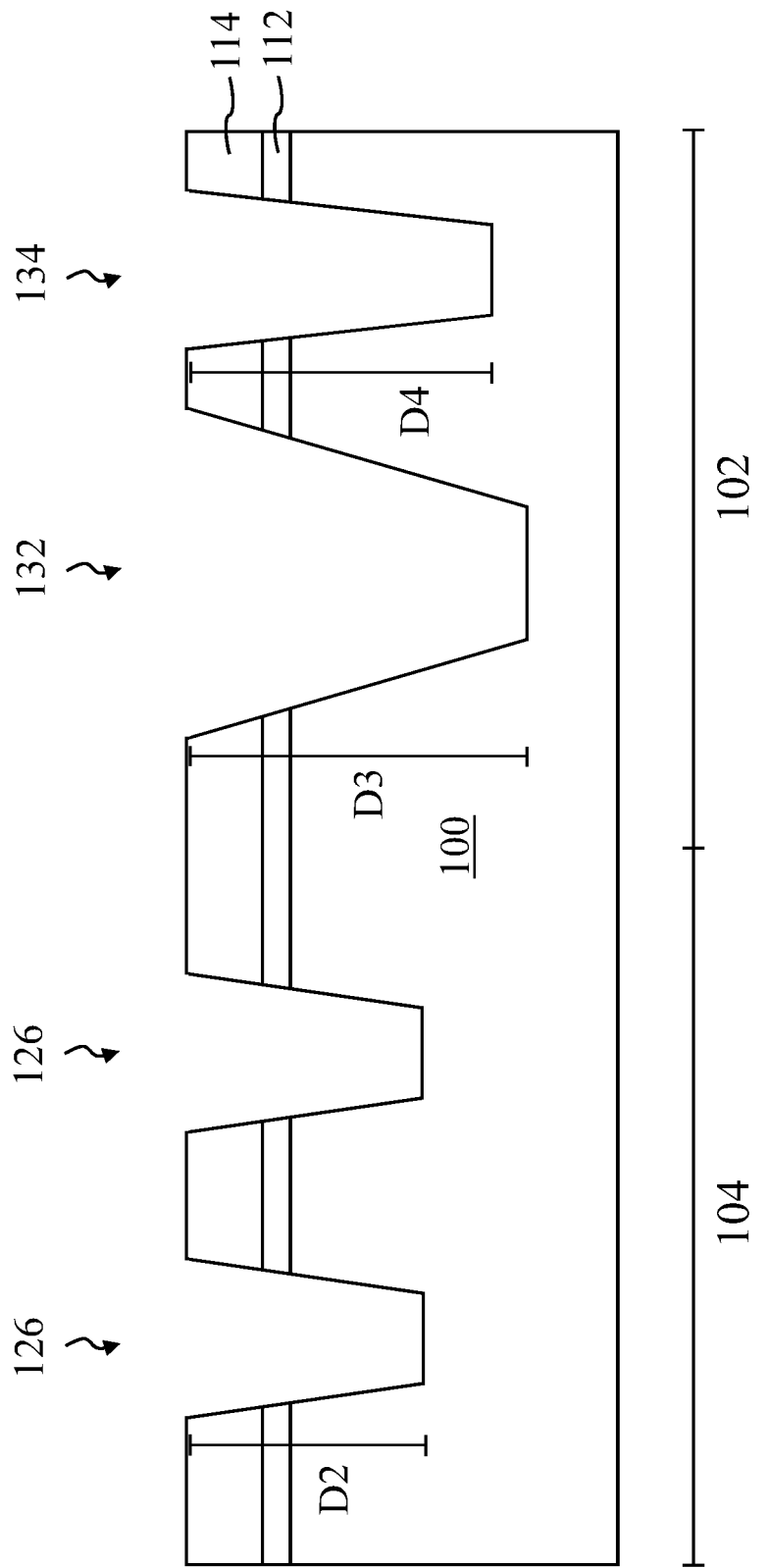

SEMICONDUCTOR STRUCTURE

PRIORITY CLAIM AND CROSS-REFERENCE

This application is a divisional application of U.S. patent application Ser. No. 16/837,904 filed on Apr. 1, 2020, entitled of "SEMICONDUCTOR STRUCTURE", which is incorporated by reference in its entirely.

BACKGROUND

Electronic equipment using semiconductor devices is essential for many modern applications. In the semiconductor devices, it is desirable to improve transistor performance even as devices become smaller due to ongoing reductions in device scale. Further, it is desirable to manufacture integrated-circuit semiconductor devices that incorporate transistors for low-, high-, and sometimes medium-voltage range applications in a single integrated circuit. The high-voltage transistors in the integrated-circuit semiconductor devices are capable of carrying far more current than the low-voltage transistors or the medium-voltage transistors.

However, the manufacturing operations of the integrated-circuit semiconductor devices that incorporate transistors having different voltage ranges involve many steps and operations on such a small and thin semiconductor device. The manufacturing of the semiconductor device in a miniaturized scale becomes more complicated. An increase in a complexity of manufacturing the semiconductor device may cause deficiencies such as low breakdown voltage or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2J are schematic views of manufacturing a semiconductor structure by a method of FIG. 1 in accordance with some embodiments of the present disclosure.

DETAILED DESCRIPTION OF THE DISCLOSURE

Figure 1:
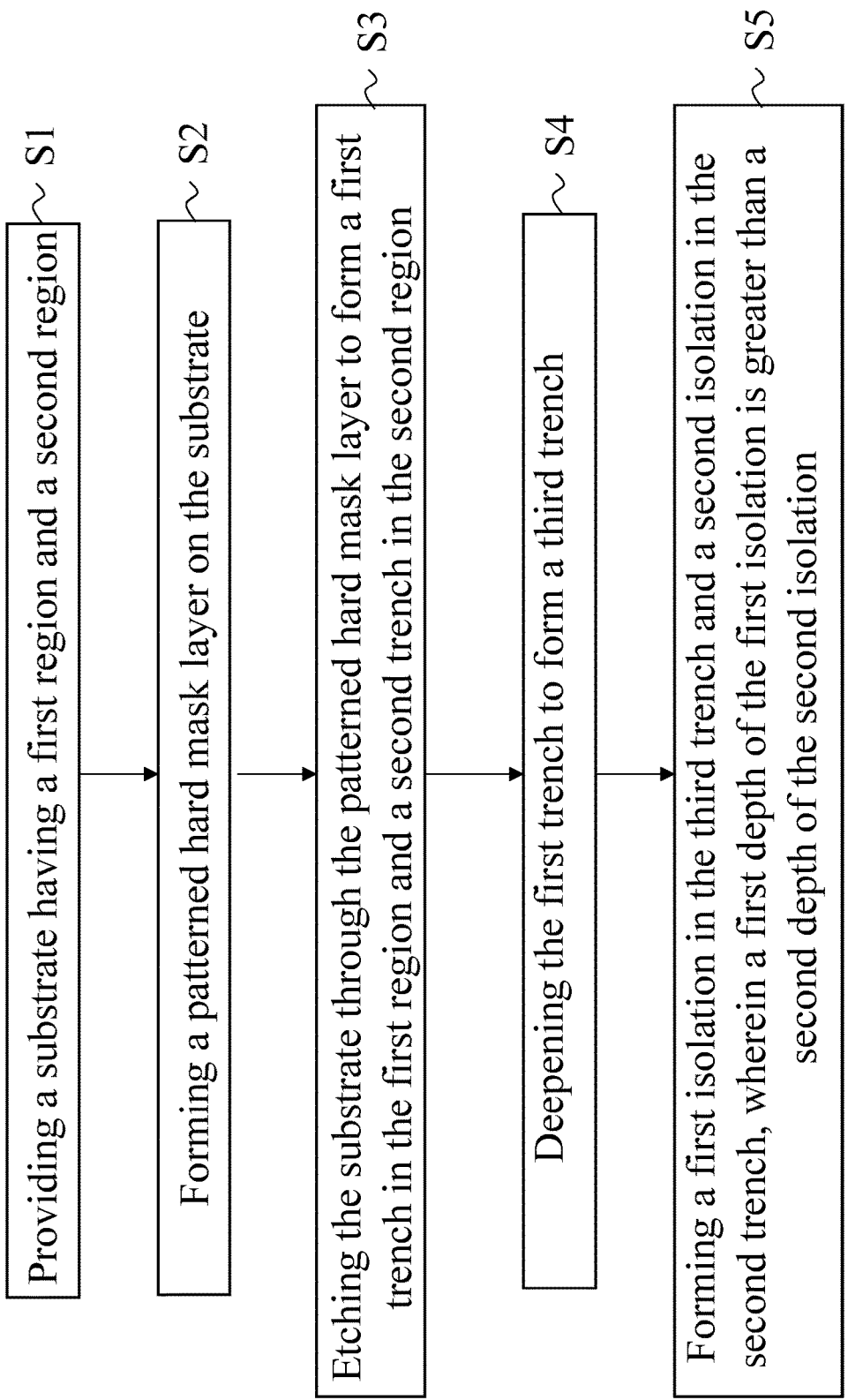
FIG. 1 is a flow diagram of a method of manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the singular terms "a," "an," and "the" may include a plurality of referents unless the context clearly dictates otherwise.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

In integrated-circuit semiconductor devices, a great number of devices are fabricated on a single chip. Different devices for low-, medium-, and high-voltage range applications are manufactured in a single integrated circuit. Different devices for different voltage range applications are operated at different voltage levels. Each device is designed to operate independently without interfering with other devices, especially under the ever-higher packing densities of the integrated-circuit semiconductor devices. Some isolations may be formed on the semiconductor substrate for separating devices that operate at different voltages and preventing current leakage between adjacent semiconductor components.

However, the isolations manufactured by standard processes may not be suitable for various kinds of devices. Devices of different voltages have different breakdown voltage ranges. The high-voltage device is designed to have a high breakdown voltage so as to be suitable for high-voltage technology. An isolation may be formed within a device for increasing the breakdown voltage of the device. The addition of the isolation between the source and the drain of the device results in an increase in breakdown voltage. The electrical performance of the high-voltage device depends on the characteristics of the isolation between the source and the drain. The isolation of the high-voltage device should be large enough to have enough breakdown voltage for the high-voltage technology.

However, a large size of the isolation results in an increase in the scale of the device. As a result, the scale of the high-voltage device may be too large for a miniaturized semiconductor structure. Further, the reduction of the size of the isolation may result in a decrease in breakdown voltage. The high-voltage device may suffer low breakdown voltage and may not be suitable for use in high-voltage technology. Thus, there is a need for isolations that meet the needs of the various devices and circuits and provide the required functionality of the circuits.

In the present disclosure, a semiconductor structure is disclosed. The depth of each isolation depends on the need and/or isolation tolerance of devices in each region. The semiconductor structure includes a first isolation having a greater depth disposed in the high-voltage region and a second isolation having a lesser depth disposed in the low-voltage region. The isolation in the low-voltage region is shallower than that in the high-voltage region, which requires more protective isolation (i.e., a deeper isolation). Therefore, the high-voltage devices can have substantially different breakdown and threshold voltages, and current-carrying capacities, than the low-voltage devices even though all of the devices are provided on the same integrated circuit, Depending on implementation, different numbers of masks (e.g., two, three) are used to generate the isolations. The deeper isolation may be formed by simply adding a photolithography process and an etching process to existing processes, Thus, the semiconductor structure may be improved.

In the present disclosure, a method of manufacturing a semiconductor structure is disclosed. In some embodiments, a semiconductor structure is formed by a method 10. The method 10 includes a number of operations and the description and illustration are not deemed as a limitation as the sequence of the operations. For illustration purposes, only operations related to a front-end process are provided. Once the front-end process is complete, a back-end process may be performed in accordance with various mechanisms. FIG. 1 is an embodiment of the method 10 of manufacturing the semiconductor structure. The method 10 includes a number of operations (S1, S2, S3, S4 and S5).

Figure 2A:
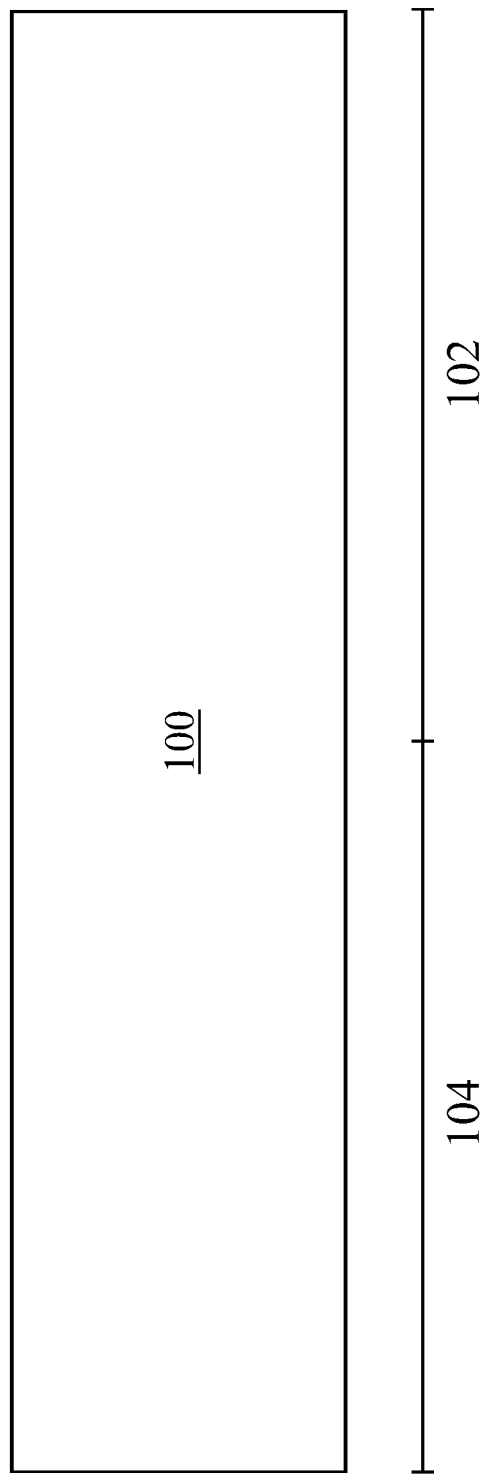

FIGS. 2A to 2J are schematic views of manufacturing a semiconductor structure by the method illustrated in FIG. 1 in accordance with some embodiments of the present disclosure. In operation S1, a substrate 100 is provided or received as shown in FIG. 2A. The substrate 100 includes silicon. In some embodiments, the substrate 100 may alternatively include silicon carbide, silicon germanium, gallium arsenic or other suitable semiconductor materials. The substrate 100 may be doped with semiconductor dopant P-type or N-type dopant). The substrate may be, for example, a P-type semiconductor substrate with a crystal orientation of <100>. Other materials may be used including GaAs or other semiconductor types, with various crystal orientations, and the substrate may be a silicon-on-insulator (SOI) substrate. The substrate 100 may further include other features such as a buried layer or an epitaxy layer.

In some embodiments, the substrate 100 has a first region 102 and a second region 104. In some embodiments, the first region 102 may include a plurality of first doping regions (not shown) suitable for a particular application. The first region 102 may be configured to be a high-voltage region. In some embodiments, the second region 104 includes a second doping region (not shown). The second region 104 may be configured to be a low-voltage region. In some embodiments, a doping concentration of the first doping regions is greater than a doping concentration of the second doping region. In some embodiments, an area of the first region 102 is substantially the same as an area of the second region 104. In some embodiments, the area of the first region 102 is greater than the area of the second region 104. In some embodiments, a ratio of the area of the first region 102 to the area of the second region 104 is between about 1 and about 1.4.

Figure 2B:
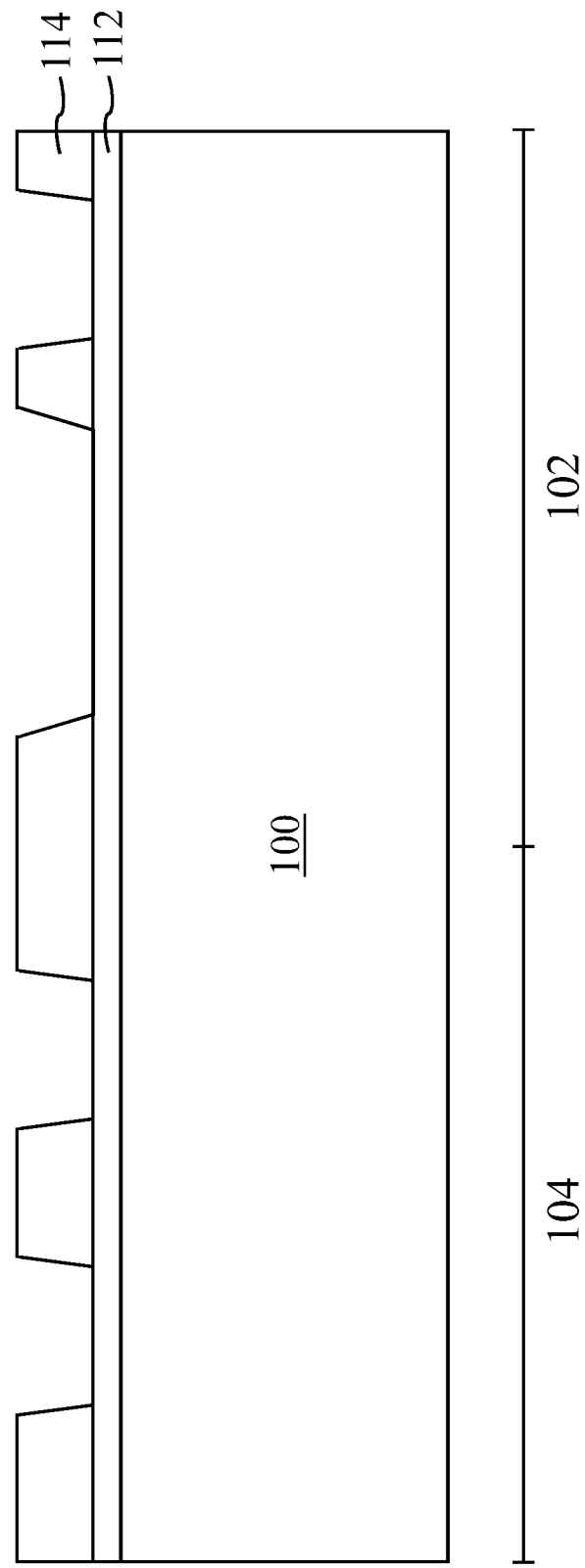

In some embodiments, an oxide layer 112 is formed on top of the substrate 100 in both the first region 102 and the second region 104 as shown in FIG. 2B. The oxide layer 112 may be a thin pad oxide layer. The oxide layer 112 may be formed over the substrate 100 by typical deposition processes, for example the depositions may be a chemical vapor deposition, a plasma-enhanced deposition, or any other blanket deposition known in the art, such as reduced pressure CVD or others.

In operation S2, a patterned hard mask layer 114 is formed on the substrate 100. In some embodiments, as shown in FIG. 2B, the patterned hard mask layer 114 is deposited on top of the oxide layer 112 in both the first region 102 and the second region 104. The patterned hard mask layer 114 may be a nitride layer. Depending on application, the patterned hard mask layer 114 may include SiN, SiON or the like. In some embodiments, the patterned hard mask layer 114 may be formed by transferring a pattern from a patterned photoresist (not shown) which is formed by a photolithography process.

Figure 2C:
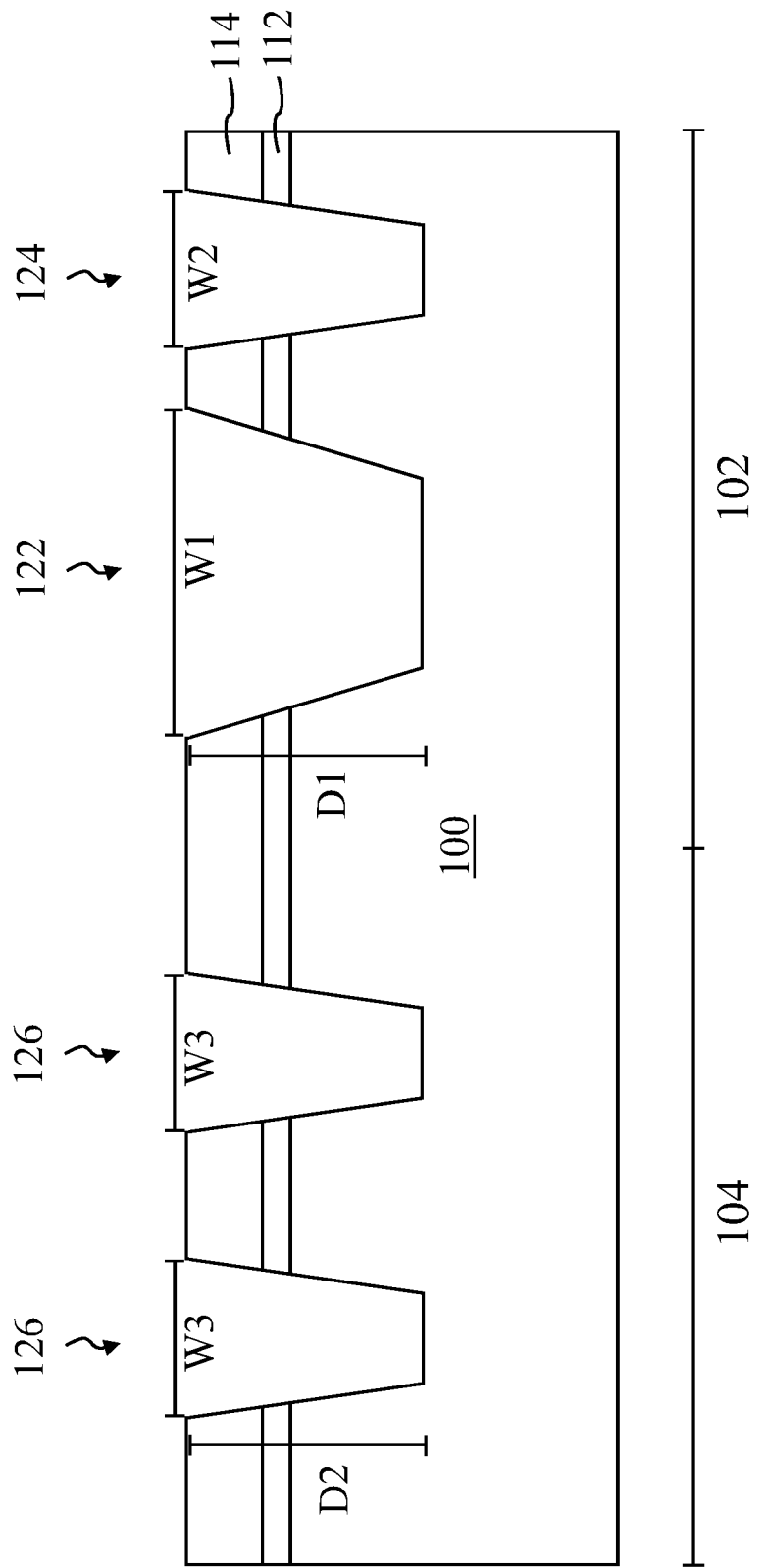

In operation S3, the substrate 100 is etched through the patterned hard mask layer 114 to form a first trench in the first region 102 and a second trench in the second region 104. Depending on implementation, different numbers of the first trenches and the second trenches may be formed to generate the isolations. The number of first trenches and the number of second trenches illustrated in FIG. 2C are both two, but are not limited thereto. In some embodiments, the first trenches include a trench 122 and a trench 124. The second trenches may include the trenches 126. In some embodiments as shown in FIG. 2C, an etching process may be performed to form the trenches 122 and 124 in the first region 102 and the trenches 126 in the second region 104. In some embodiments, the etching process may include a liquid or plasma chemical agent provided to remove part of the substrate 100 in the areas that are not protected by the patterned hard mask layer 114.

In some embodiments as shown in FIG. 2C, bottom surfaces of the trenches 122, 124 and 126 may be substantially on a same level. The depth of the trench 122 and the depth of the trench 124 may be substantially the same. Both of the trench 122 and the trench 124 may have a depth D1. Depending on implementation, different sizes of trenches may be formed to generate the isolations. In some embodiments, a width W1 of the trench 122 may be greater than a width W2 of the trench 124. The trenches 126 may have a depth D2 and a width W3, in some embodiments, the depth D2 may be substantially the same as the depth D1. In some embodiments, the width W3 of the trench 126 may be substantially the same as the width W2 of the trench 124. In other words, the size of the trench 124 and the size of the trench 126 may be substantially the same, but the disclosure is not limited thereto. In some embodiments, the width W1 of the trench 122 may be greater than the width W3 of the trench 126. In some embodiments, openings of the trenches 122, 124 and 126 may be greater than the bottom surfaces of the trenches 122, 124 and 126. Depending on implementation, different shapes of the trenches may be formed to generate the isolations.

Figure 2D:
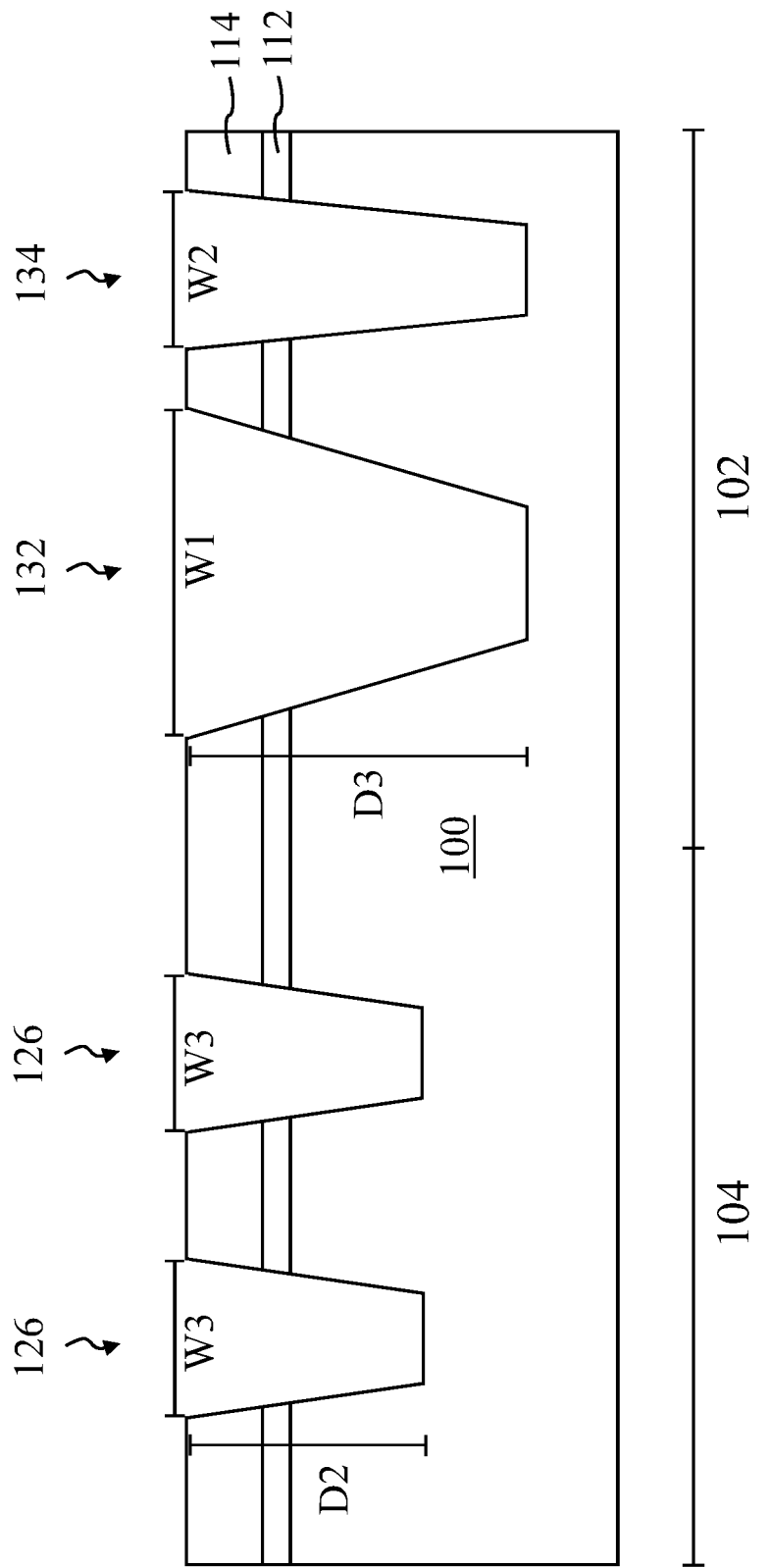

In operation S4, the first trench is deepened to form a third trench. In some embodiments as shown in FIG. 2D, an etching process may be performed to deepen the trenches 122 and 124 in the first region 102. In some embodiments, the trenches 122 and 124 in the first region 102 may be etched through the patterned hard mask layer 114. In some embodiments, the trenches 122 and 124 in the first region 102 may etched through another patterned hard mask layer (not shown). An etching operation including a liquid or plasma chemical agent may be provided to remove part of the substrate 100 in the areas that are not protected by the patterned hard mask layer. The trenches 122 and 124 may be deepened to respectively form the trenches 132 and 134 in the first region 102.

In some embodiments, the trenches 132 and 134 may have a depth D3. Bottom surfaces of the trenches 132 and 134 and bottom surfaces of the trenches 126 may be on different levels. In some embodiments, the depth D3 of the trenches 132 and 134 is greater than the depth D2 of the trenches 126. In some embodiments, a ratio of the depth D3 to the depth D2 is between about 1.1 and about 1.5. In some embodiments, a ratio of the depth D3 to the depth D2 is about 1.3. In some embodiments, the depth D3 of the trenches 132 and 134 may be greater than approximately 2500 angstroms. In some embodiments, the depth D3 of the trenches 132 and 134 may be greater than approximately 3000 angstroms. In some embodiments, the depth D3 of the trenches 132 and 134 may be greater than approximately 3500 angstroms. In some embodiments, the depth D3 of the trenches 132 and 134 may be less than approximately 6000 angstroms. In some embodiments, the depth D3 of the trenches 132 and 134 may be approximately 4000 angstroms.

Figure 2E:
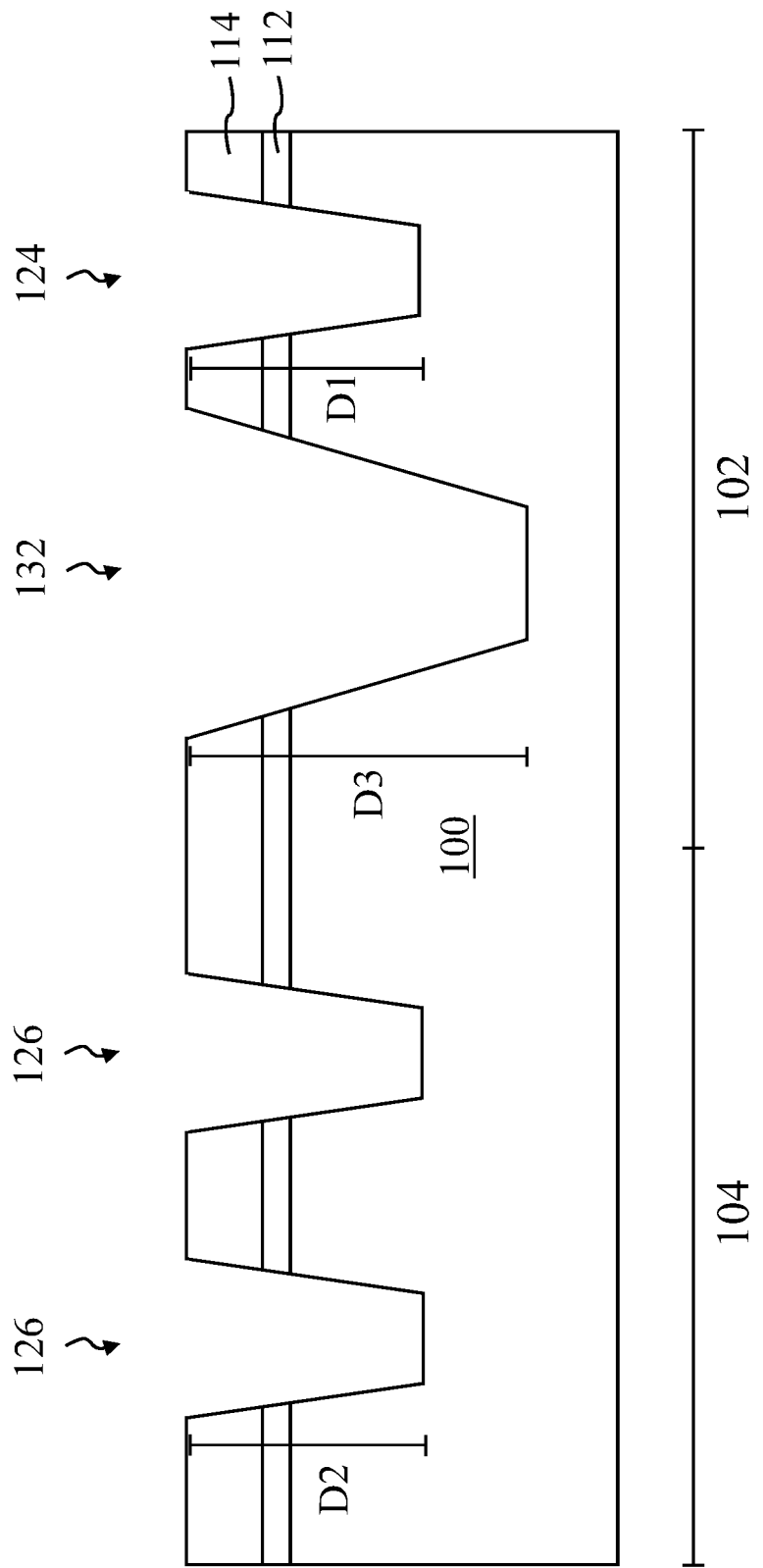

Depending on implementation, different depths of the trenches may be formed to generate the isolations. In some embodiments as shown in FIG. 2E, the trenches 132 and 124 may have different depths. The trench 124 in the first region 102 may have a depth D1 substantially the same as the depth D2 of the trench 126 in the second region 104. The trench 132 in the first region 102 may have a depth D3 greater than the depth D2 of the trench 126 in the second region 104. The operation S4 may be performed on the trench 122 in the first region 102, leaving the trench 124 in the first region 102 in place. The width of the trench 124 in the first region 102 may be substantially the same as the width of the trench 126 in the second region 104. The trench 124 in the first region 102 and the trenches 126 in the second region 104 may have same depths and same widths, but the disclosure is not limited thereto. In some embodiments, the width of the trench 132 in the first region 102 may be greater than the width of the trench 124 in the first region 102 and the width of the trench 126 in the second region 104.

In some embodiments, as shown in FIG. 2F, the trenches 132 and 134 in the first region 102 may have different depths. Further, the depth D3 of the trench 132 may be greater than the depth D4 of the trench 134. In some embodiments, both depths D3 and D4 max be greater than the depth D2 of the trench 126. An etching process may be performed to deepen the trench 132 in the first region 102 such that the depths of the trenches 132 and 134 are different. A value of the depth D4 of the trench 134 may be between a value of the depth D3 of the trench 132 and a value of the depth D2 of the trench 126. The width of the trench 134 in the first region 102 may be substantially the same as the width of the trench 126 in the second region 104. In some embodiments, the width of the trench 132 in the first region 102 may be greater than the width of the trench 134 in the first region 102 and the width of the trench 126 in the second region 104.

Figure 2G:
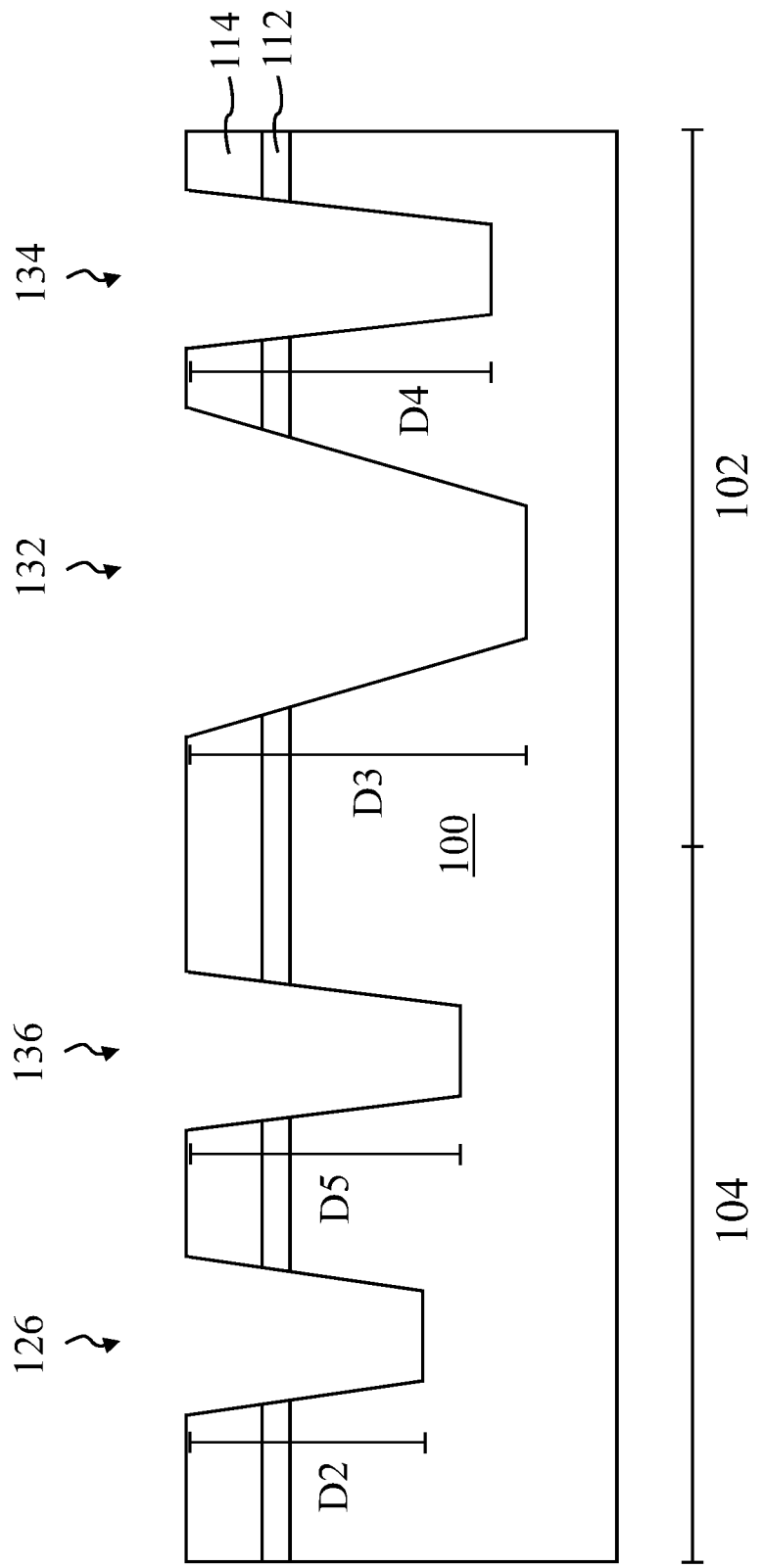

In some embodiments as shown in FIG. 2G, the trenches 126 and 136 in the second region 104 may have different depths. One of the trenches 126 may be deepened to form the trench 136. The depth D5 of the trench 136 may be greater than the depth D2 of the trench 126. The depth D5 of the trench 136 in the second region 104 may be less than the depth D4 of the trench 134 in the first region 102. In some embodiments, the depth D5 of the trench 136 in the second region 104 may be greater than or equal to the depth D4 of the trench 134 in the first region 102. In some embodiments, the width of the trench 126 and the width of the trench 136 in the second region 104 are substantially the same. Further, the width of the trench 134 in the first region 102 may be substantially the same as the width of the trench 126 in the second region 104. Please note that the description below continues to refer to FIG. 2D.

Figure 2H:
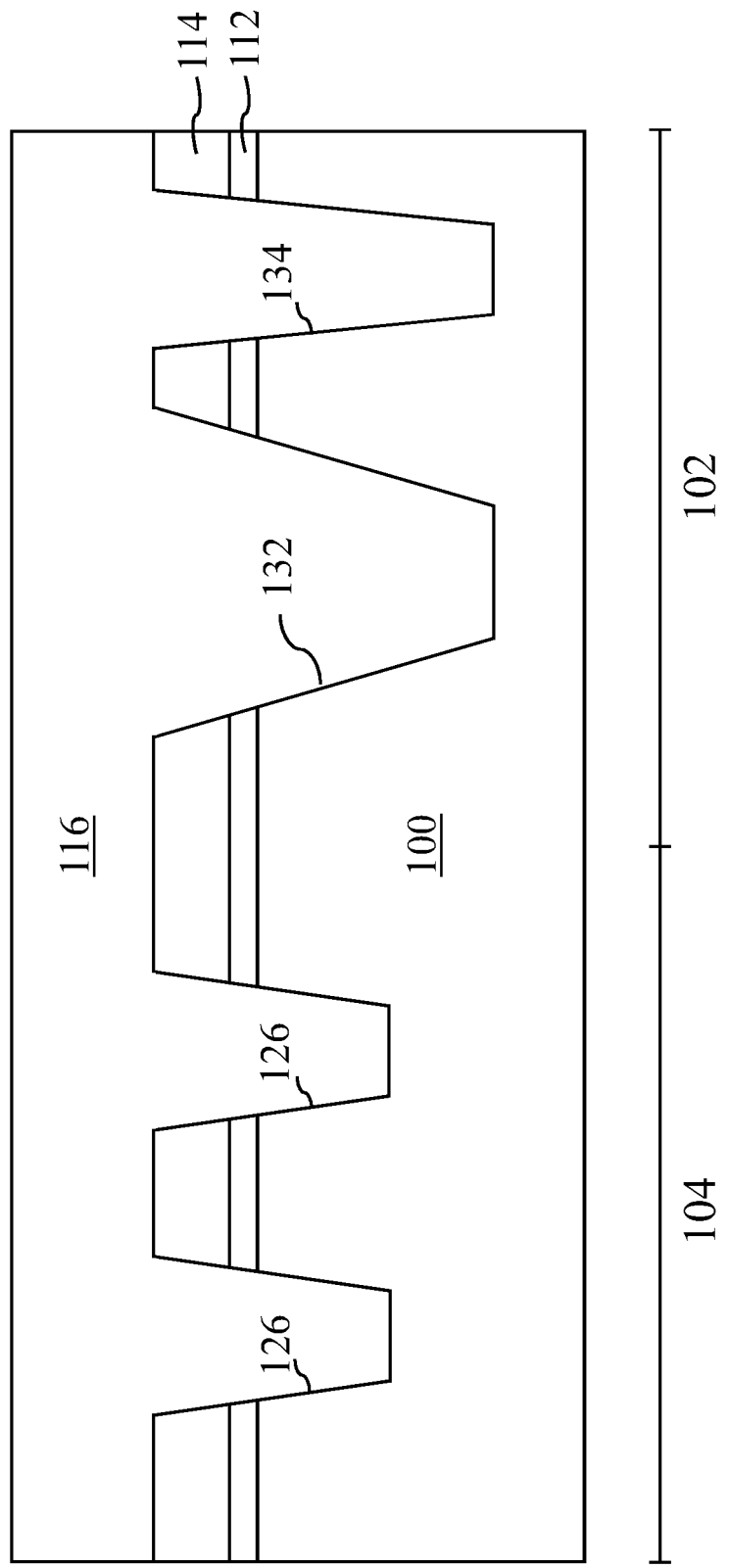

In some embodiments, as shown in FIG. 2H, an isolation layer 116 is formed over the substrate 100. The isolation layer 116 may be formed on the top of the patterned hard mask layer 114 in both the first region 102 and the second region 104. In some embodiments, the trenches 132 and 134 in the first region 102 and the trenches 126 in the second region 104 are filled with a chemical vapor deposited (CVD) or high-density plasma deposited (HDP) insulator, which is typically an oxide. The isolation layer 116 may include dielectric materials such as silicon oxide. The isolation layer 116 is deposited to a thickness completely filling the trenches 132 and 134 in the first region 102 and the trenches 126 in the second region 104 and overlying the patterned hard mask layer 114 as shown in FIG. 2H.

Figure 2I:
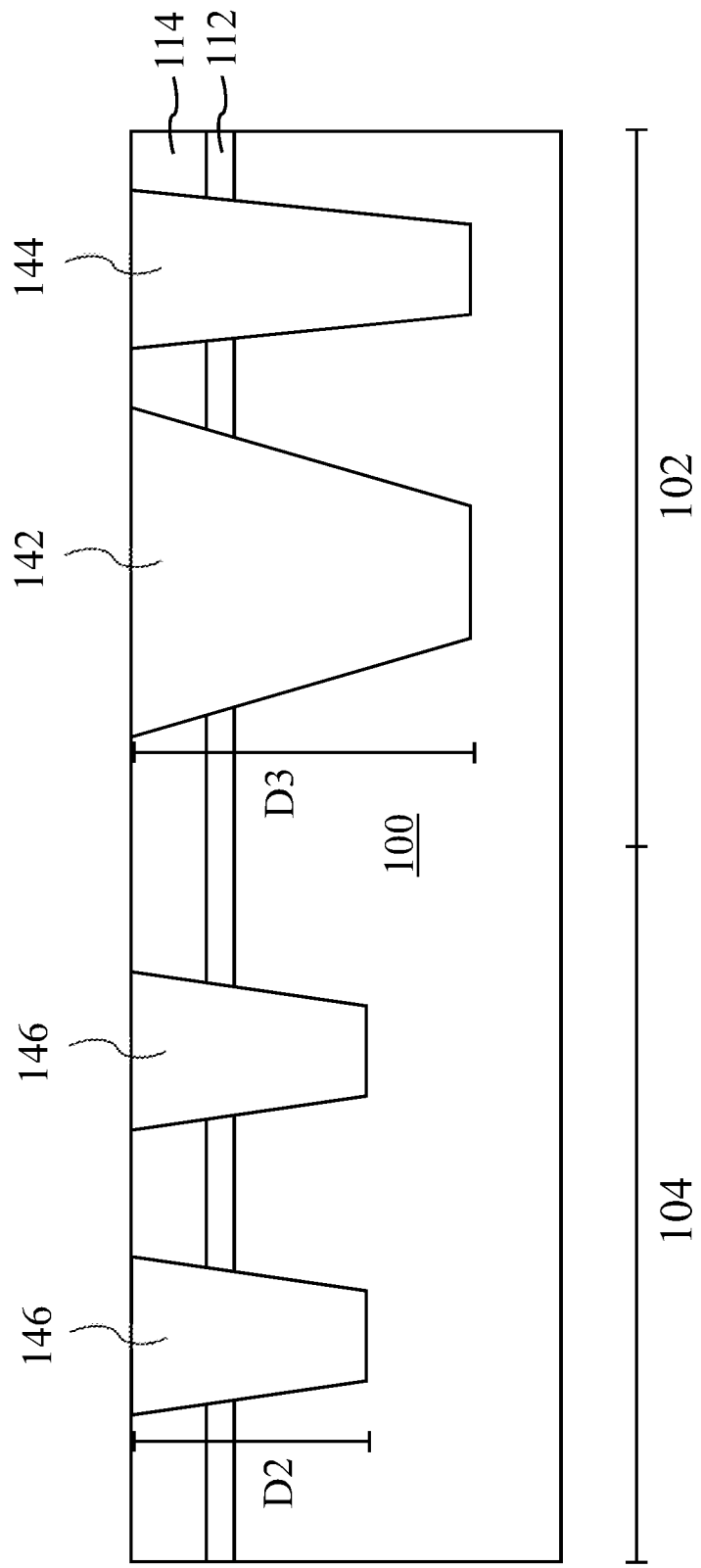

In operation S5, a first isolation is formed in the third trench and a second isolation is formed in the second trench, wherein a first depth of the first isolation is greater than a second depth of the second isolation. In some embodiments as shown in FIG. 2I, a chemical mechanical polishing (CMP) is performed across the substrate 100. The isolation layer 116 is planarized and removed from all areas outside of the trenches 132 and 134 in the first region 102 and the trenches 126 in the second region 104. Thus, the remaining portion of the isolation layer 116 in the trenches 132 and 134 forms the isolations 142 and 144 in the first region 102, and the remaining portion of the isolation layer 116 in the trenches 126 forms the isolations 146 in the second region 104. Depending on implementation, different numbers of first isolations and second isolations may be formed to achieve the required arrangement. The number of first isolations and the number of second isolations illustrated in FIG. 2I are two, but are not limited thereto. The number of first isolations and the number of second isolations correspond to the number of trenches formed previously.

In some embodiments, as shown in FIG. 2I, the isolations 142 and 144 have a depth D3 corresponding to the depth of the trenches 132 and 134 in the first region 102. The isolations 146 have a depth D2 corresponding to the depth of the trenches 126 in the second region 104. In some embodiments, a ratio of the depth D3 of the isolations 142 and 144 to the depth D2 of the isolations 146 is greater than 1.2. In some embodiments, a ratio of the depth D3 of the isolations 142 and 144 to the depth D2 of the isolations 146 is about 1.3. In some embodiments, the isolations 142 and 144 and the isolations 146 may have different widths. The widths of the isolations 142 and 144 correspond to the openings of the trenches 132 and 134 in the first region 102. The widths of the isolations 146 correspond to the openings of the trenches 126. In some embodiments, a width of the isolation 144 is substantially the same as a width of the isolation 146.

Figure 2J:
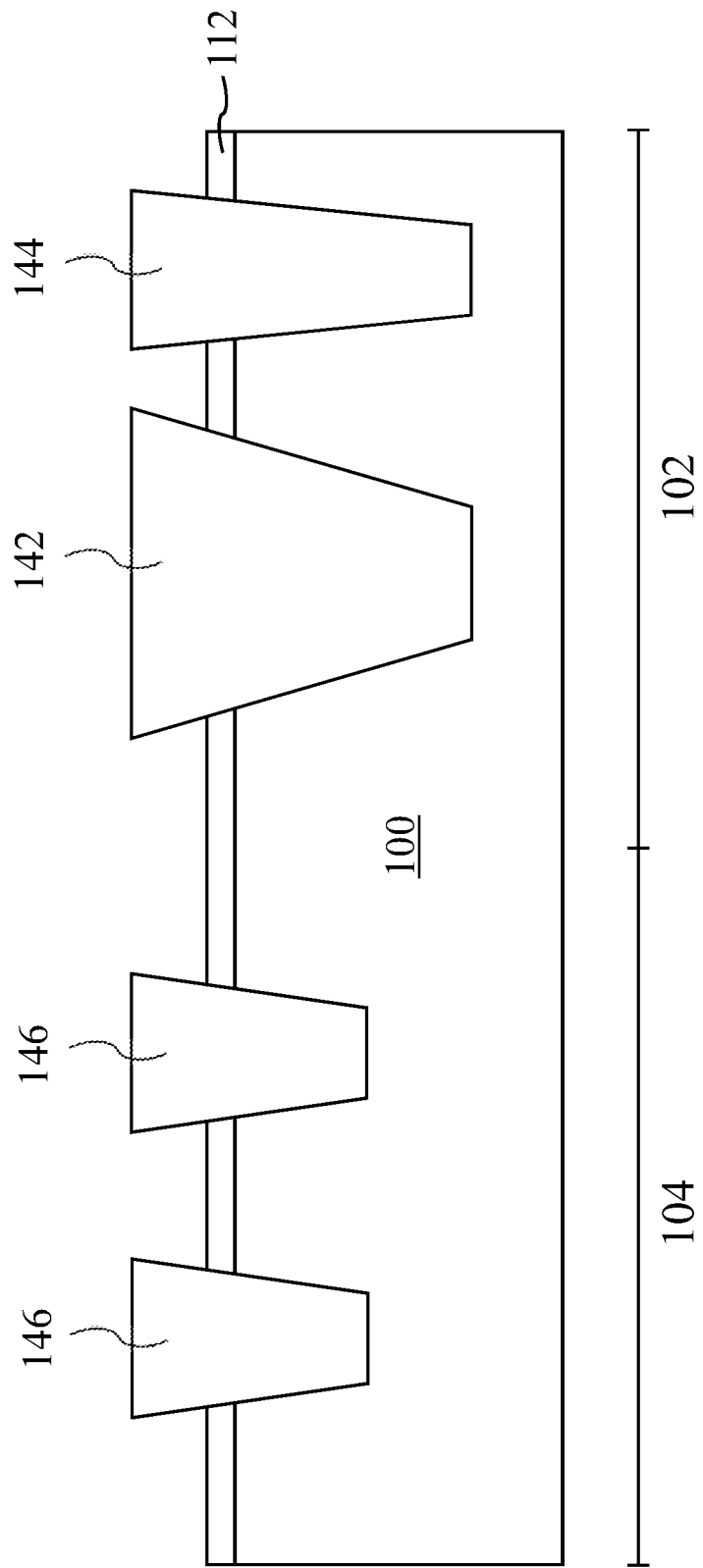

In some embodiments, as shown in FIG. 2J, the patterned hard mask layer 114 is removed from the substrate 100. The removal of the patterned hard mask layer 114 may be done using conventionally-known processes. In some embodiments, the patterned hard mask layer 114 is removed by anisotropic RIE etching using chlorine ($Cl_2$) or carbon tetrafluoride ($CF_4$) as an etchant. In some embodiments, the oxide layer 112 may be removed from the substrate 100 as well. The removal of the oxide layer 112 may be done using conventionally-known processes. In some embodiments, the oxide layer 112 is etched after the patterned hard mask layer 114 is removed. The oxide layer 112 may be etched using $CHF_3$ as the etchant.

After the removal of the patterned hard mask layer 114, parts of sidewalls of the isolations 142 and 144 are exposed through the substrate 100, as shown in FIG. 2J. Parts of sidewalls of the isolations 146 may be exposed through the substrate 100 as well. In some embodiments, top surfaces of the isolations 142 and 144 are higher than a top surface of the substrate 100. Top surfaces of the isolations 146 may be higher than the top surface of the substrate 100. In some embodiments, the top surfaces of the isolations 142 and 144 and the top surfaces of the isolations 146 are substantially on a same level.

Figure 3:
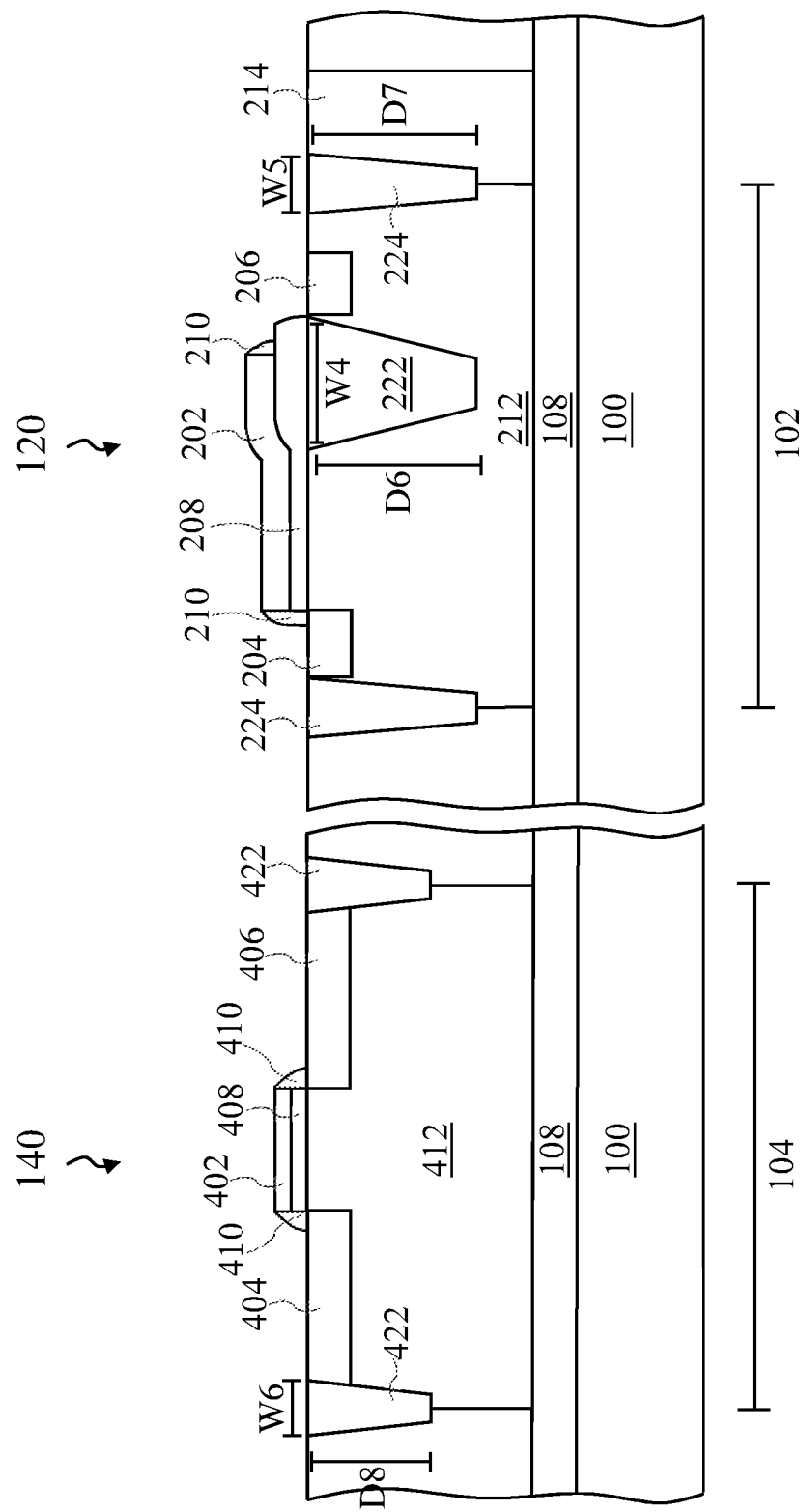
FIG. 3 is a schematic cross-sectional view of a semiconductor structure in accordance with some embodiments of the present disclosure.

Referring to FIG. 3, FIG. 3 is a schematic cross-sectional view of a semiconductor structure 20 in accordance with some embodiments of the present disclosure. FIG. 3 depicts the completed structure; the remaining process steps needed to transition from the semiconductor structure of FIG. 2J to the completed semiconductor structure of FIG. 3 are all conventional steps and familiar to those skilled in the art, and therefore descriptions of such process steps are not included herein. As shown in FIG. 3, the semiconductor structure 20 includes a substrate 100. The substrate 100 may include a first region 102 and a second region 104. The first region 102 may be configured to be a high-voltage region, and the second region 104 may be configured to be a low-voltage region. In some embodiments, an area of the first region 102 is substantially the same as an area of the second region 104. In some embodiments, the area of the first region 102 is greater than the area of the second region 104. In some embodiments, a ratio of the area of the first region 102 to the area of the second region 104 is between about 1 and about 1.4.

In some embodiments, a deep well is formed in the substrate 100. In some embodiments, the deep well can be a deep n-well 108 located in the substrate 100 in both the first region 102 and the second region 104. In some embodiments, a high-voltage well 212 and a low-voltage well 214 are located in the substrate 100 in the first region 102. In some embodiments, the high-voltage well 212 and the low-voltage well 214 may have different doping polarities. In some embodiments, the doping polarities of the high-voltage well 212 and the low-voltage well 214 are the same. In some embodiments, both of the high-voltage well 212 and the low-voltage well 214 can be separated from the substrate 100 by the deep n-well 108, as shown in FIG. 3.

The high-voltage well 212 may have an N-type dopant such as phosphorus. The high-voltage well 212 may be referred to as an N-well region, a high-voltage N-well, or an HVNW. In some embodiments, the high-voltage well 212 may have a P-type dopant such as boron. The high-voltage well 212 may be referred to as a P-well region, a high-voltage P-well, or an HVPW. In some embodiments, the low-voltage well 214 laterally contacts the high-voltage well 212, as shown in FIG. 3. In some alternative embodiments, the low-voltage well 214 is separated from the high-voltage well 212. The low-voltage well 214 may have an N-type dopant. The low-voltage well 214 may be referred to as an N-well region. In some embodiments, the low-voltage well 214 may have a P-type dopant. The low-voltage well 214 may be referred to as a P-well region.

In some embodiments, as shown in FIG. 3, a low-voltage well 412 may be located in the second region 104 of the substrate 100. The low-voltage well 412 may have an N-type dopant or a P-type dopant. Depending on the type of dopants, the low-voltage well 412 may be referred to as a low-voltage P-well (LVPW) or a low-voltage N-well (LVNW). In some embodiments, a doping concentration of the high-voltage well 212 may be greater than a doping concentration of the low-voltage well 412. In some embodiments, the low-voltage well 412 laterally contacts the high-voltage well 212. In some alternative embodiments, the low-voltage well 412 is separated from the high-voltage well 212, as shown in FIG. 3.

Doping regions including the high-voltage well 212 and the low-voltage wells 214 and 412 may be formed by suitable doping processes such as ion implantation. For example, the high-voltage well 212 and low-voltage wells 214 and 412 may be formed by a series of chain-implanting processes. In some embodiments, the high-voltage well 212 and low-voltage wells 214 and 412 may be formed, respectively, by a plurality of processing operations now known or to be developed such as growing a sacrificial oxide such as the oxide layer 112 on the substrate 100, opening a pattern for the location of the N-well region or P-well region, and implanting the impurities.

In some embodiments as shown in FIG. 3, a first device 120 may be formed over the high-voltage well 212. The first device 120 may include a first gate 202, a first source 204, a first drain 206 and a first gate dielectric 208. In some embodiments, the first source 204 and the first drain 206 of the first device 120 may be N+ implanted regions or P+ implanted regions. The first source 204 and the first drain 206 may be used to receive contacts (not shown). The first source 204 and the first drain 206 may be formed by ion implantation and/or diffusion. Other processing operations may be further included to form the first source 204 and the first drain 206. For example, a rapid thermal annealing (RTA) process may be used to activate the implanted dopant. The first source 204 and the first drain 206 may have different doping profiles formed by multi-step implantation. For example, additional doping features such as lightly-doped drain (LDD) or double-diffused drain (DDD) may be included. In addition, the first source 204 and the first drain 206 may have different structures, such as raised, recessed, or strained. A channel may be formed between the first source 204 and the first drain 206.

In some embodiments, as shown in FIG. 3, the first gate 202 is formed on the substrate 100 and interposed laterally between the first source 204 and the first drain 206. In some embodiments, the first device 120 is configured as a high-voltage device. The first gate 202 may include the first gate dielectric 208 having a thickness such that a high voltage is applicable to operate the first device 120. The first gate dielectric 208 may include silicon oxide, high dielectric-constant (high k) materials, silicon oxynitride, other suitable material, or a combination thereof. The first gate dielectric 208 may be formed using chemical vapor deposition (CVD), physical vapor deposition (PVD), atomic layer deposition (ALD), thermal oxide, other suitable processes, or a combination thereof. The first gate 202 may be coupled to metal interconnects and is disposed overlying the first gate dielectric 208. The first device 120 may further include spacers 210 formed on both sides of the first gate 202 and the first gate dielectric 208.

In some embodiments as shown in FIG. 3, the first device 120 may be formed in the first region 102 covering a portion of an isolation 222. The first gate 202 of the first device 120 may extend over the isolation 222 between the first source 204 and the first drain 206. In some embodiments, the first gate 202 may extend over the isolation 222. The isolation 222 may be disposed in the high-voltage well 212. In some embodiments, the isolation 222 may be separated from the deep n-well 108. In some embodiments, the isolation 222 may contact the deep n-well 108. The isolation 222 may be disposed laterally between the first source 204 and the first drain 206. The isolation 222 may be adjacent to the first drain 206. The presence of the isolation 222 between the first source 204 and the first drain 206 may increase the breakdown voltage of the first device 120.

In addition to the isolation 222, the semiconductor structure 20 may further include various isolation features such as isolations 224 located and designed to define various active features and isolate them from each other. The first device 120 may be adjacent to an isolation 224. In some embodiments, as shown in FIG. 3, the isolations 224 may be disposed adjacent to the high-voltage well 212. The isolations 224 may be disposed between the high-voltage well 212 and the low-voltage well 214. In some embodiments, the isolation 224 may be separated from the deep n-well 108. In some embodiments, the isolation 224 may contact the deep n-well 108.

The isolations 222 and 224 may have same or different depths. The depth D6 of the isolation 222 may be deep enough that a high voltage (for example, a voltage between about 1 volt and about 20 volts) is applicable to operate the first device 120. The breakdown voltage of the first device 120 may be increased by the isolation 222 so that the first device may be operated at a high voltage. The depths D7 of the isolations 224 may be deep enough to prevent current leakage from the first device 120 to adjacent devices (for example, the second device 140). In some embodiments, the depth of the isolation 222 may be greater than those of the isolations 224. Depending on implementation, the depths of the isolations 224 may be greater than or equal to that of the isolation 222.

In some embodiments, the depths D6 and D7 may be greater than approximately 2500 angstroms. In some embodiments, the depths D6 and D7 may be greater than approximately 3000 angstroms. In some embodiments, the depths D6 and D7 may be between about 3000 and about 3500 angstroms. In some embodiments, the depths D6 and D7 may be approximately 3000 angstroms. The depth D6 can be decided depending on different voltage requirements. Additionally, the breakdown voltage of the first device 120 may proportional to the depth D6 of the isolation 222.

The isolations 222 and 224 may have same or different widths. The width W4 of the isolation 222 may be wide enough so that a high voltage is applicable to operate the first device 120. The width W4 of the isolation 222 is designed to be narrow enough so that the area of the first region 102 occupied by the first device 120 may remain small. The size of the first device 120 may be small enough to be applied to greater and greater packing densities of the integrated-circuit semiconductor devices. The width W5 of the isolation 224 may be great enough to prevent current leakage from the first device 120 to adjacent devices. In some embodiments, the width of the isolation 222 may be greater than those of the isolations 224. Depending on implementation, the widths of the isolations 224 may be greater than or equal to that of the isolation 222.

In some embodiments, the width W4 may be less than approximately 3700 angstroms. In some embodiments, the width W4 may be between about 2700 and about 3700 angstroms. In some embodiments, the width W5 may be less than approximately 3700 angstroms. In some embodiments, the width W5 may be between about 2700 and about 3700 angstroms. In some embodiments, a ratio of the depth D6 to the width W4 is between about 1 and about 2. In some embodiments, a ratio of the depth D7 to the width W5 is between about 1 and about 2.

In some embodiments, as shown in FIG. 3, the widths of the isolations 222 and 224 may be limited to a certain range such that the area of the first region 102 is substantially the same as the area of the second region 104. On the other hand, the depth of the isolation 222 may be as great as possible to provide suitable breakdown voltage for the first device 120. Further, the depths of the isolations 224 may be as great as possible to define the active area for the first device 120 and isolate the first device 120 from other active features.

In some embodiments, as shown in FIG. 3, a second device 140 may be formed in the second region 104 adjacent to the isolation 422. The second device 140 may be formed over the low-voltage well 412. The second device 140 may include a second gate 402, a second source 404 and a second drain 406. The second gate 402, the second source 404 and the second drain 406 may have the same composition as the first gate 202, the first source 204 and the first drain 206, respectively. In some embodiments, a voltage level of the first device 120 may be greater than a voltage level of the second device 140. In some embodiments, the second device 140 is configured as a low-voltage device.

The second gate 402 may include a second gate dielectric 408 having a small thickness such that a low voltage is applicable to operate the second device 140. In some embodiments, a thickness of the first gate dielectric 208 is greater than a thickness of the second gate dielectric 408. In some embodiments, a size of the first gate 202 is substantially greater than a size of the second gate 402. The second device 140 may further include spacers 410 formed on both sides of the second gate 402 and the second gate dielectric 408.

In some embodiments, as shown in FIG. 3, the second device 140 may further include various isolation features such as the isolations 422 located and designed to define various active features and isolate them from each other. The isolations 422 may be disposed adjacent to the second drain 406 or the second source 404. The isolations 422 may be disposed adjacent to the low-voltage well 412. In some embodiments, the isolation 224 may be separated from the deep n-well 108. In some embodiments, the isolation 224 may contact the deep n-well 108. The isolations 422 may have the same composition as the isolations 222 and 224. The isolations 422 may be shallow trench isolations (STI) or other suitable isolation structures.

Depending on implementation, the isolations 422 may have same or different depths. The depths D8 of the isolations 422 may be deep enough to prevent current leakage from the second device 140 to adjacent devices (fix example, the first device 120). In some embodiments, the depths D8 may be less than approximately 3000 angstroms. In some embodiments, the depths D8 may be between about 500 and about 2700 angstroms. In some embodiments, the depths D8 may be between about 500 and about 1000 angstroms. In some embodiments, a ratio of the depth D6 of the isolation 222 to the depth D8 of the isolation 422 is greater than 1.2. In some embodiments, a ratio of the depth D6 of the isolation 222 to the depth D8 of the isolation 422 is about 1.3. In some embodiments, a ratio of the depth D7 of the isolation 224 to the depth D8 of the isolation 422 is greater than 1.2. In some embodiments, a ratio of the depth D7 of the isolation 224 to the depth D8 of the isolation 422 is about 1.3.

The isolations 422 may have same or different widths. In some embodiments, as shown in FIG. 3, the widths W6 of the isolations 422 are substantially the same. The widths W6 of the isolations 422 are designed to be narrow enough so that the area of the second region 104 occupied by the second device 140 may be small. In some embodiments, the widths W6 of the isolations 422 are substantially the same as the widths W5 of the isolations 224. The semiconductor structure 20 may be applied to the integrated-circuit semiconductor devices having greater and greater packing densities.

The semiconductor structure 20 described above has deeper isolations 222 and 224, and shallower isolations 422 in different voltage regions. The isolations 224 and the isolations 422 are arranged to isolate the first device 120 and the second device 140 from each other. The first device 120 in the high-voltage region 102 desires more protective isolation. The deeper isolation 222 formed in the high-voltage region 102 may provide a way to improve both the breakdown voltage and threshold voltage of the first device 120.

Accordingly, the first device 120 is operable at a high voltage applied between the first drain 206 and the first source 204, while the second device 140 is operable at a low voltage applied between the second drain 406 and the second source 404. In some embodiments, the high voltage applied between the first drain 206 and the first source 204 is between about 20 volts and about 32 volts, and the low voltage applied between the second drain 406 and the second source 404 is between about 0.8 volts and about 1.3 volts. The deep isolations 222 and 224 may be formed by simply adding a photolithography and an etching process to existing processes. Thus, the semiconductor structure may be improved in a cost effective manner.

Figure 4:
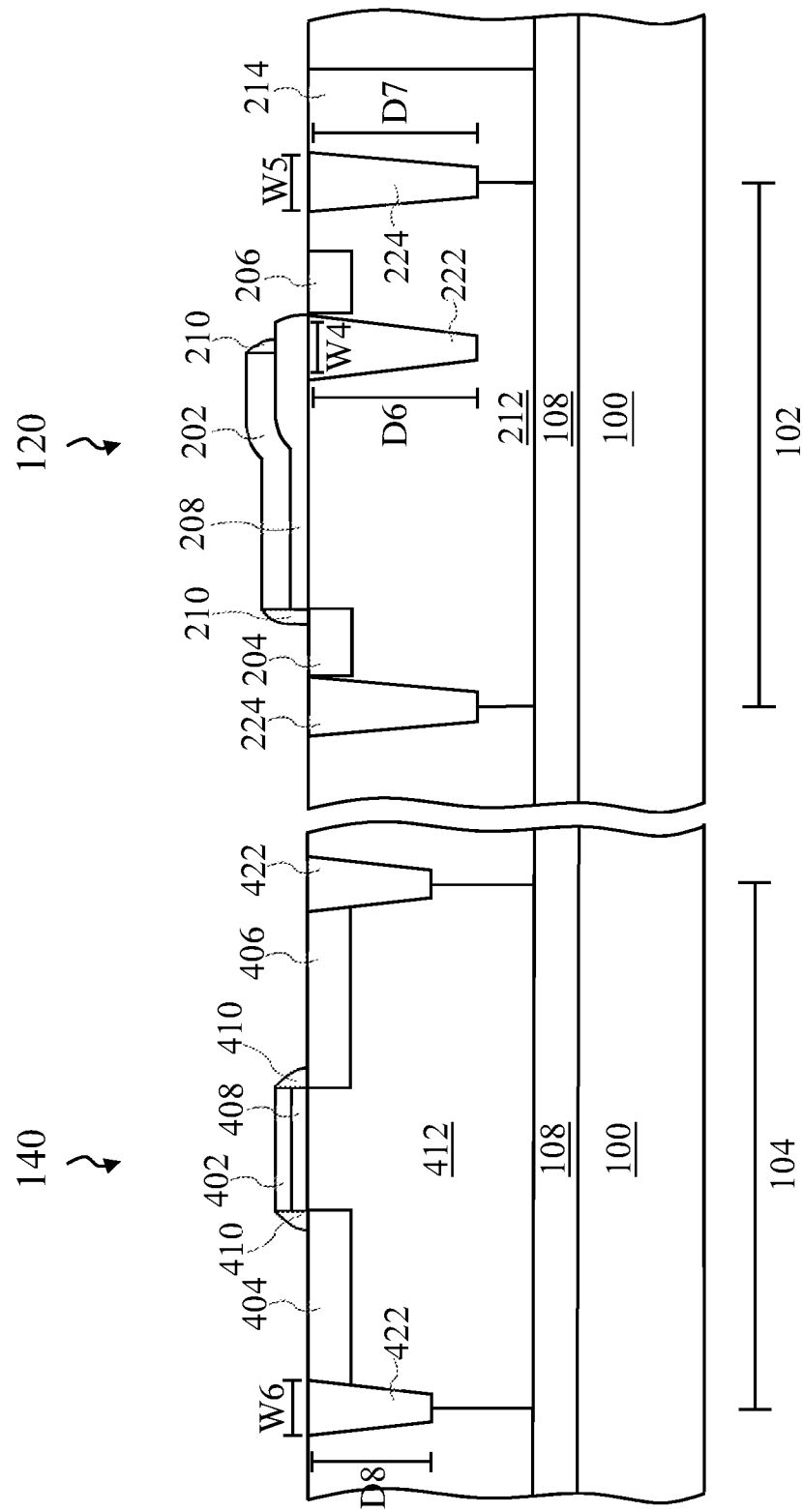
FIG. 4 is a schematic cross-sectional view of a semiconductor structure in accordance with some embodiments of the present disclosure.

Other alternatives or embodiments may be used without departure from the spirit and scope of the present disclosure. FIG. 4 is a schematic cross-sectional view of a semiconductor structure 30 in accordance with various embodiments of the present disclosure. In some embodiments, the semiconductor structure 30 includes a first device 120 and a second device 140, which have configurations similar to those described above or illustrated in FIG. 3.

In some embodiments, the first device 120 may overlap a portion of the isolation 222 and may be adjacent to the isolations 224. Depending on implementation, similar widths of the isolations 222 and 224 may be adopted. The width W4 of the isolation 222 and the width W5 of the isolation 224 may be substantially the same. The width W4 and the width W5 may be limited to a certain range so that the area of the first region 102 is substantially the same as the area of the second region 104. In some embodiments, the width W5 of the isolation 224 and the width W6 of the isolation 422 are substantially the same.

In some embodiments, the width W6 of the isolation 422 may be substantially the same as the width W4 of the isolation 222. The widths of the isolations 222 and 224 may be designed to be substantially the same as the widths of the isolations 422. Thus, the area of the first region 102 may be substantially the same as the area of the second region 104. Accordingly, the semiconductor structure 30 may be applied to the integrated-circuit semiconductor devices having greater and greater packing densities.

In some embodiments, the depths of the isolations 222 and 224 may be the same or different. The depth D6 of the isolation 222 and the depth D7 of the isolation 224 may be substantially the same. The depth D6 of the isolation 222 may be greater than the depth D7 of the isolation 224 in order to provide sufficient breakdown voltage for the first device 120. On the other hand, the isolations 224 used for isolating the first device 120 from the second device 140 may desire a lesser depth compared to the depth of the isolation 222. In some embodiments, the depth D6 of the isolation 222 and the depth D7 of the isolation 224 are substantially greater than the depth D8 of the isolation 422.

Figure 5:
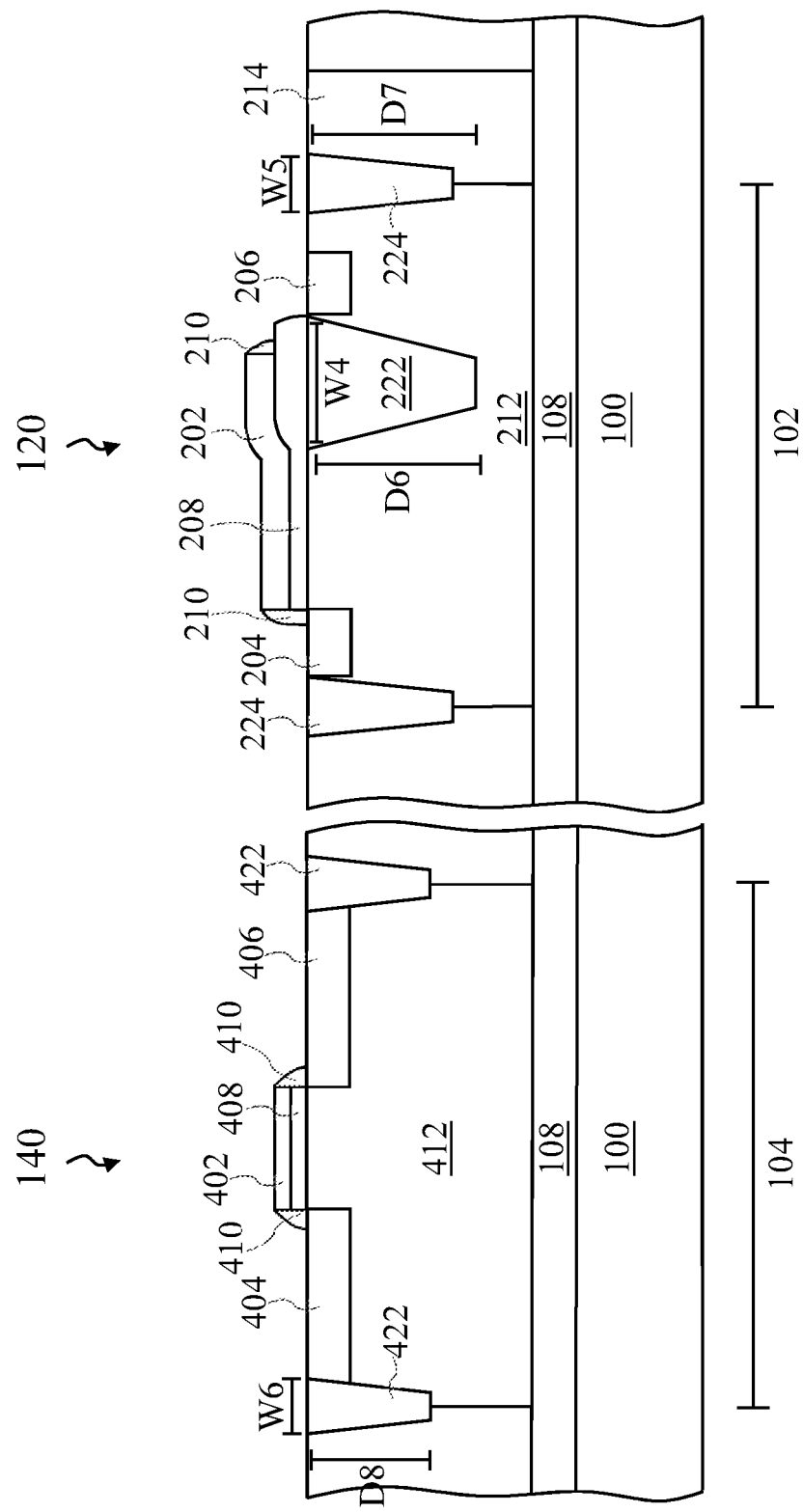
FIG. 5 is a schematic cross-sectional view of a semiconductor structure in accordance with some embodiments of the present disclosure.

FIG. 5 is a schematic cross-sectional view of a semiconductor structure 40 in accordance with various embodiments of the present disclosure. In some embodiments, the semiconductor structure 40 includes a first device 120 and a second device 140, which have configurations similar to those described above or illustrated in FIG. 3.

In some embodiments, the first device 120 may overlap a portion of the isolation 222 and may be adjacent to the isolations 224. Depending on implementation, different widths of the isolations 222 and 224 may be adopted. The width W4 of the isolation 222 may be greater than the width W5 of the isolation 224. The width W4 of the isolation 222 may provide sufficient breakdown voltage for the first device 120. In some embodiments, the width W5 of the isolation 224 and the width W6 of the isolation 422 are substantially the same.

In some embodiments, the depths of the isolations 222 and 224 may be different. The depth D6 of the isolation 222 may be greater than the depth D7 of the isolation 224. The first device 120 may be operable at a high voltage applied between the first drain 206 and the first source 204, which desires a greater depth D6 of the isolation 222. The isolations 224 may be used to isolate the first device 120 from the second device 140, which desires a lesser depth D7 compared to the depth D6 of the isolation 222. In some embodiments, the depth D6 of the isolation 222 and the depth D7 of the isolation 224 are substantially greater than the depth D8 of the isolation 422. The depth D7 may be greater than the depth D8 and less than the depth D6.

Figure 6:
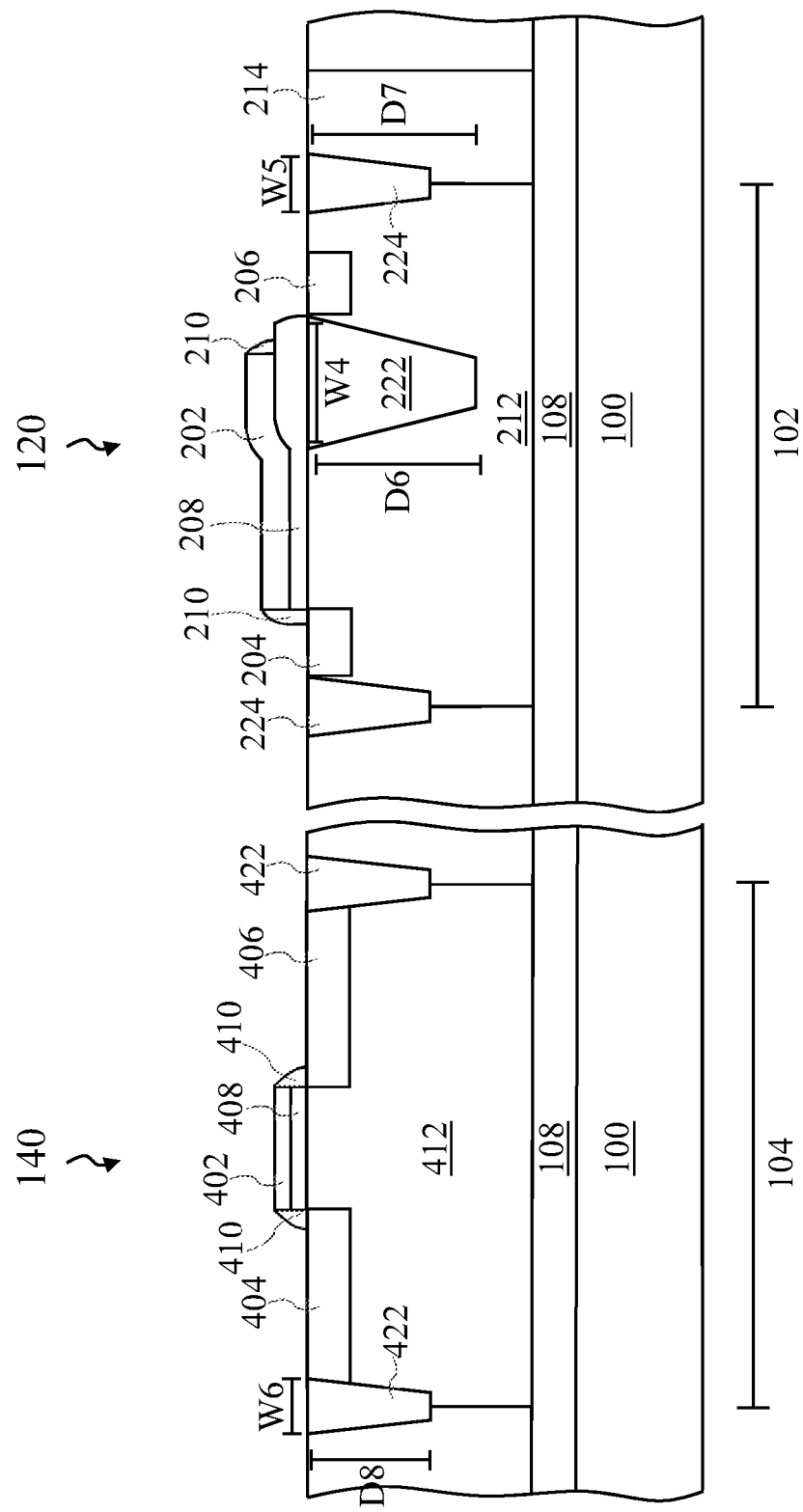
FIG. 6 is a schematic cross-sectional view of a semiconductor structure in accordance with some embodiments of the present disclosure.

FIG. 6 is a schematic cross-sectional view of a semiconductor structure 50 in accordance with various embodiments of the present disclosure. In some embodiments, the semiconductor structure 50 includes a first device 120 and a second device 140, which have configurations similar to those described above or illustrated in FIG. 3.

In some embodiments, the depths of the isolations 222 and 224 may be different. The depth D6 of the isolation 222 may be greater than the depth D7 of the isolations 224. In some embodiments, the depth D7 of the isolations 224 and the depth D8 of the isolation 422 are substantially the same. Both the isolations 224 and the isolations 422 are designed to isolate different active features in the semiconductor structure 50. Thus, the isolations 224 and the isolations 422 may have a lesser depth compared to the depth D6 of the isolation 222.

Figure 7:
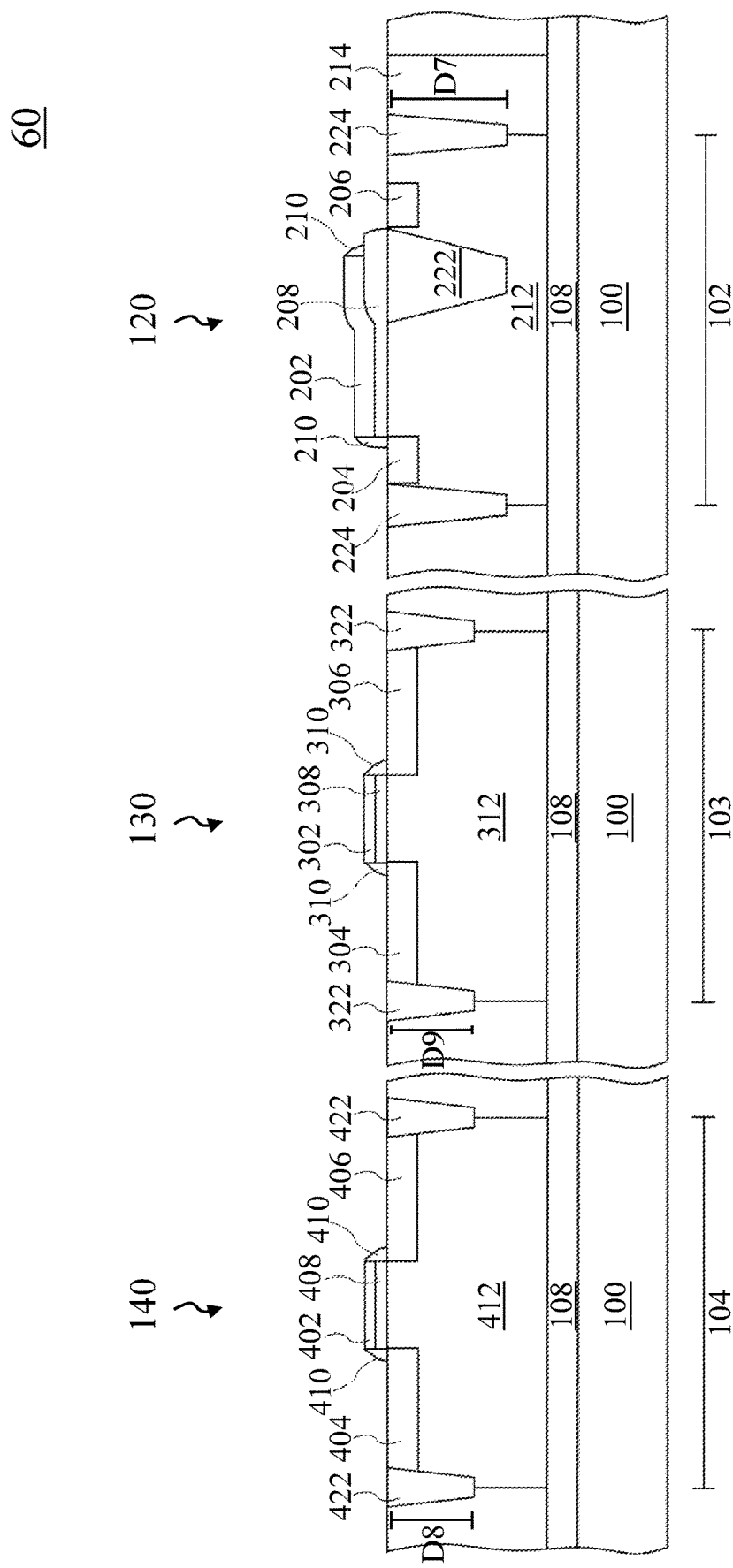
FIG. 7 is a schematic cross-sectional view of a semiconductor structure in accordance with some embodiments of the present disclosure.

FIG. 7 is a schematic cross-sectional view of a semiconductor structure 60 in accordance with various embodiments of the present disclosure. In some embodiments, the semiconductor structure 60 includes a first device 120 and a second device 140, which have configurations similar to those described above or illustrated in FIG. 3.

The semiconductor structure 60 may further include a third region 103. In some embodiments, the area of the third region 103 and the area of the second region 104 may be substantially the same. In some embodiments, a ratio of the area of third region 103 to the second region 104 is between about 1 and about 1.2. In some embodiments, the area of the third region 103 and the area of the first region 102 may be substantially the same. In some embodiments, a ratio of the area of first region 102 to the area of the third region 103 is between about 1 and about 1.2.

The semiconductor structure 60 may further include a third device 130 disposed in the third region 103. A voltage level of the third device 130 may be greater than the voltage level of the second device 140, but less than the voltage level of the first device 120. In some embodiments, the third device 130 is configured as a medium-voltage device. The third device 130 may be formed in the medium-voltage well 312. In some embodiments, a doping concentration of the medium-voltage well 312 may be between the doping concentration of the high-voltage well 212 and the doping concentration of the low-voltage well 412. In some embodiments, the third region 103 (and the medium-voltage well 312) can be located between the first region 102 (and the high-voltage well 212) and the second region 104 (and the low-voltage well 412), as shown in FIG. 7, but the disclosure is not limited thereto. In some embodiments, the medium-voltage well 312 laterally contacts the high-voltage well 212 and/or the low-voltage well 412. In some alternative embodiments, the low-voltage well 412 is separated from the high-voltage well 212 and/or the low-voltage well 412, as shown in FIG. 7. In some embodiments, the medium-voltage well 312 can be separated from the substrate 100 by the deep n-well 108, as shown in FIG. 7.

The third device 130 may include a third gate 302, a third source 304 and a third drain 306. The third gate 302, the third source 304 and the third drain 306 may have the same composition as the second gate 402, the second source 404 and the second drain 406, respectively. The third gate 302 may include a third gate dielectric 308 having a thickness such that a medium voltage is applicable to operate the third device 130. In some embodiments, a thickness of the third gate dielectric 308 is between the thickness of the second gate dielectric 408 and the thickness of the first gate dielectric 208. The third device 130 may further include spacers 310 formed on both sides of the third gate 302 and the third gate dielectric 308.

In some embodiments as shown in FIG. 7 the third device 130 may further include isolation features such as the isolations 322 located and designed to define various active features and isolate them from each other. The isolations 322 may be disposed adjacent to the third drain 306 or the third source 304. The isolations 322 may be disposed adjacent to the medium-voltage well 312. In some embodiments, the isolations 322 may be separated from the deep n-well 108. In some embodiments, the isolations 322 may contact the deep n-well 108. The isolations 322 may have the same composition as the isolations 422. The isolations 322 may be shallow trench isolations (STI) or other suitable isolation structures.

Depending on implementation, the isolations 322 may have same or different depths. The depths D9 of the isolations 322 may be deep enough to prevent current leakage from the third device 130 to adjacent devices (for example, the first device 120 and the second device 140). In some embodiments, the depths D9 may be less than approximately 3500 angstroms. In some embodiments, the depths D9 may be between about 1200 and about 3500 angstroms. In some embodiments, the depths D9 may be between about 1200 and about 2000 angstroms.

In some embodiments, top surfaces of the isolations 222 and 224, top surfaces of the isolations 422, and top surfaces of the isolations 322 are substantially on a same level. In some embodiments, the depths D9 of the isolations 322 and the depths D8 of the isolations 422 may be substantially the same. In some embodiments, a ratio of the depth D9 of the isolation 322 to the depth D8 of the isolation 422 is about 1.3. The depths D9 of the isolations 322 may be substantially less than the depths D7 of the isolations 224. In some embodiments, a ratio of the depth D7 of the isolation 224 to the depth D9 of the isolation 322 is about 1.

The semiconductor structure 60 described above has deeper isolations 222 and 224, and shallower isolations 422 and isolations 322 in different voltage regions. The isolations 422 and the isolations 322 are arranged to isolate the second device 140 and the third device 130 from other active features. The first device 120 in the high-voltage region 102 requires more protective isolation, and thus the deep isolations 222 and 224 are formed in the high-voltage region 102.

Figure 8:
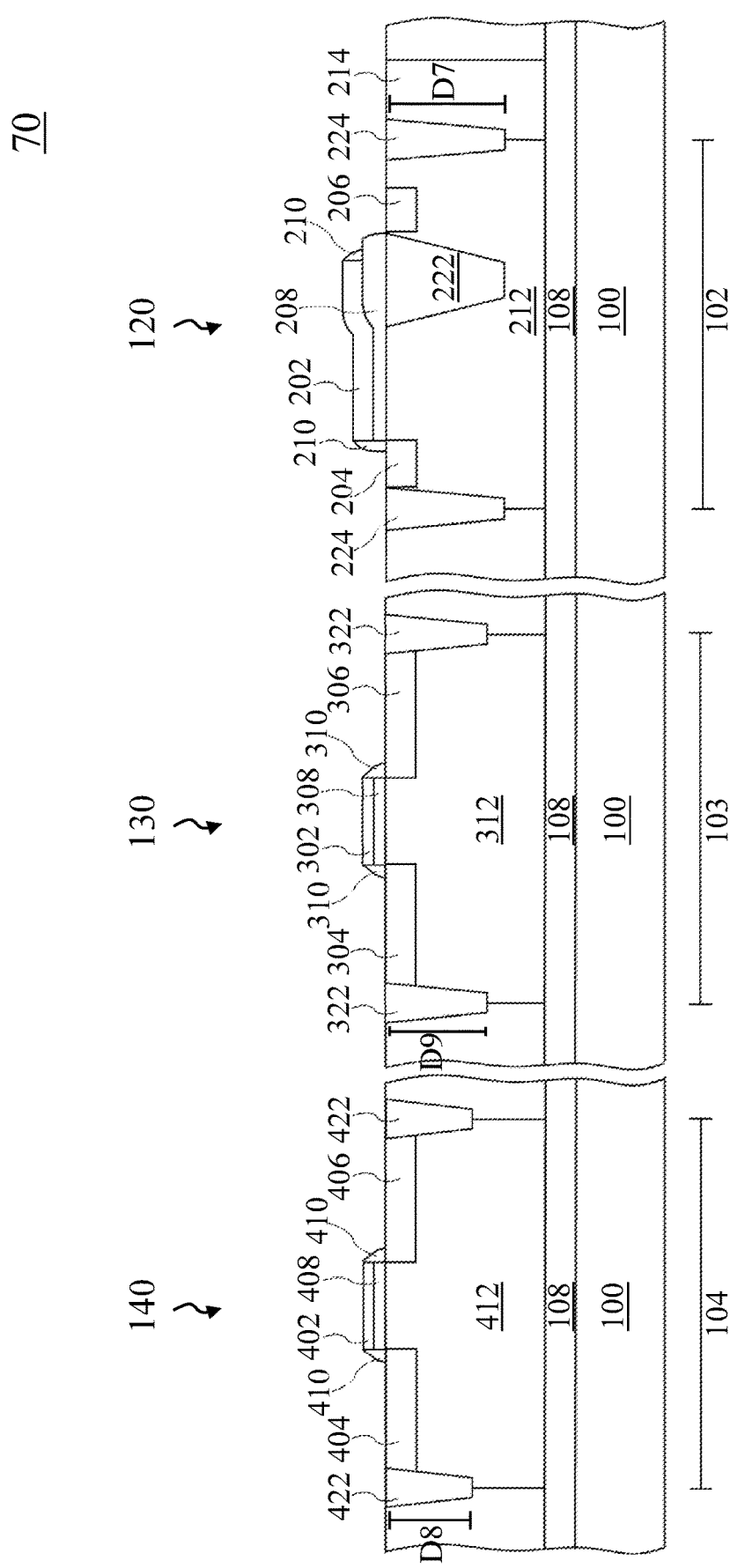
FIG. 8 is a schematic cross-sectional view of a semiconductor structure in accordance with some embodiments of the present disclosure.

FIG. 8 is a schematic cross-sectional view of a semiconductor structure 70 in accordance with various embodiments of the present disclosure. In some embodiments, the semiconductor structure 70 includes a first device 120, a second device 140 and a third device 130, which have configurations similar to those described above or illustrated in FIG. 7.

In some embodiments, bottom surfaces of the isolations 222 and 224, bottom surfaces of the isolations 422 and bottom surfaces of the isolations 322 are on different levels. In some embodiments, the depths D9 of the isolations 322 are greater than the depths D8 of the isolations 422. In some embodiments, a ratio of the depth D9 of the isolation 322 to the depth D8 of the isolation 422 is greater than 1.2. The depths D9 of the isolations 322 may be substantially less than the depths D7 of the isolations 224. In some embodiments, a ratio of the depth D7 of the isolation 224 to the depth D8 of the isolation 322 is greater than 1.2.

The semiconductor structure 70 described above has isolations of different depths in different voltage regions. The deepest isolations 222 and 224 are arranged in the first region 102 for the high-voltage applications. The isolations 422 are arranged to isolate the second device 140 from active features. The third device 130 in the middle-voltage region 103 desires more protective isolation compared to the second device 140, and thus the deeper isolations 322 are formed in the middle-voltage region 103.

Figure 9:
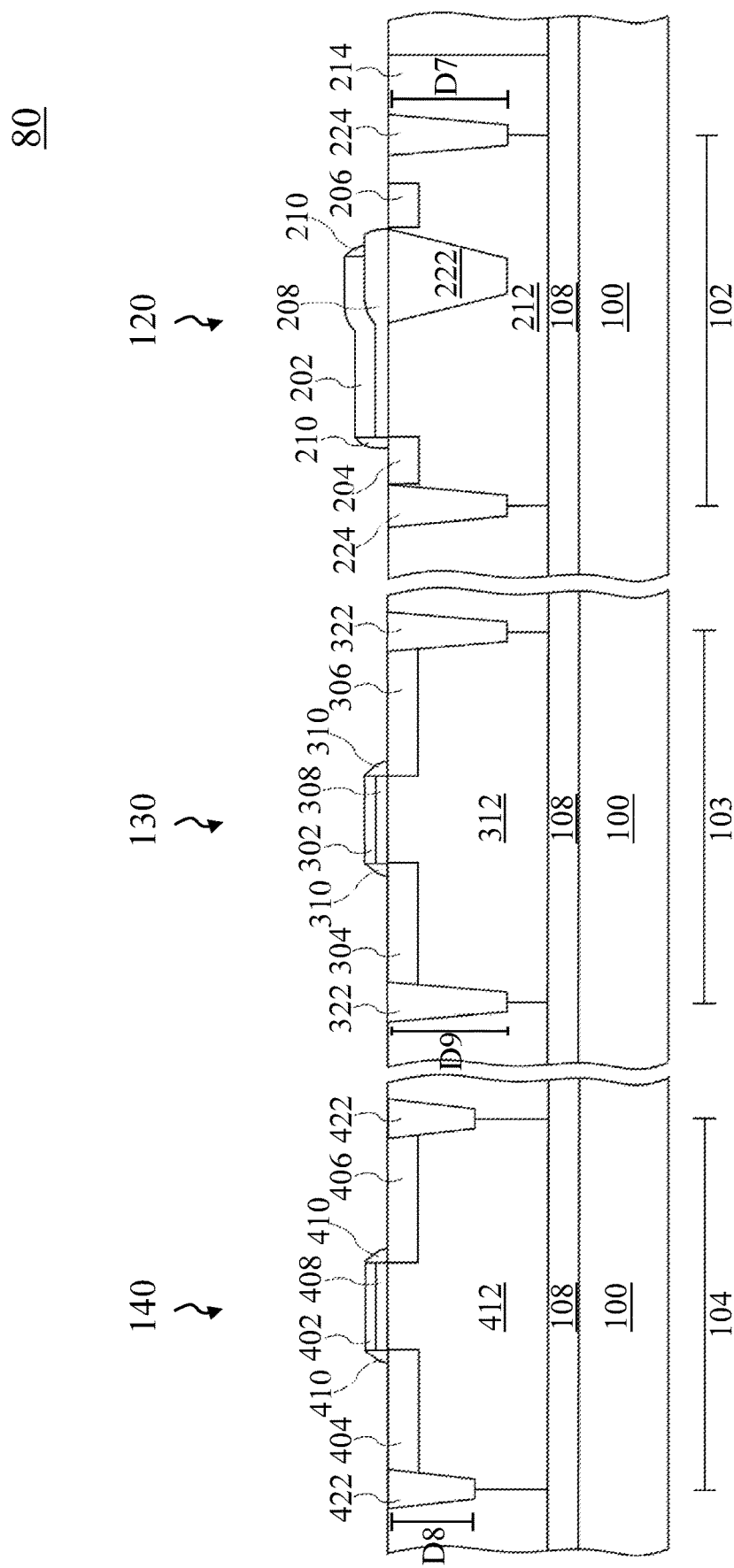
FIG. 9 is a schematic cross-sectional view of a semiconductor structure in accordance with some embodiments of the present disclosure.

FIG. 9 is a schematic cross-sectional view of a semiconductor structure 80 in accordance with various embodiments of the present disclosure. In some embodiments, the semiconductor structure 80 includes a first device 120, a second device 140 and a third device 130, which have configurations similar to those described above or illustrated in FIG. 7.

In some embodiments, bottom surfaces of the isolations 222 and 224 and bottom surfaces of the isolations 322 may be on a same level. In some embodiments, the depths D9 of the isolations 322 are greater than the depths D8 of the isolations 422. In some embodiments, a ratio of the depth D9 of the isolation 322 to the depth D8 of the isolation 422 is greater than 1.2. The depths D9 of the isolations 322 and the depths D7 of the isolations 224 may be substantially the same. In some embodiments, a ratio of the depth D7 of the isolation 224 to the depth D8 of the isolation 322 is about 1.

The semiconductor structure 80 described above has deeper isolations 222, 224 and 322, and shallower isolations 422 in different voltage regions. The isolations 422 are arranged to isolate the second device 140 from other active features. The first device 120 in the high-voltage region 102 and the third device 130 in the middle-voltage region 103 requires more protective isolation compared to the second device 140, and thus deeper isolations 222 and 224, and isolations 322 are respectively formed in the high-voltage region 102 and the middle-voltage region 103 respectively.

In the present disclosure, a semiconductor structure is disclosed. The semiconductor structure includes an isolation having a depth corresponding to the voltage level of the semiconductor devices. The depth of each isolation depends on the need and/or isolation tolerance of devices in each region. Therefore, the high-voltage devices can have substantially different breakdown and threshold voltages compared to the low-voltage devices on the same integrated circuit. The deep isolation may be formed by simply adding a photolithography and an etching process to existing processes. Thus, the semiconductor structure may be improved and may be manufactured in a cost effective way.

In some embodiments, a semiconductor structure includes a substrate including a first region and a second region; a first device disposed in the first region and a second device disposed in the second region, wherein the first device comprises a first source, a first drain, a first gate dielectric and a first spacer; and a first isolation disposed in the first region, wherein the first isolation is between the first source and the first drain, the first spacer overlaps the first isolation, the first isolation is separated from the first spacer by the first gate dielectric.

In some embodiments, a semiconductor structure includes a semiconductor substrate; a first device disposed in a first region, wherein the first device comprises a first spacer; and a first isolation in the first region, wherein the first device overlaps the first isolation, the first spacer has a first sidewall and a second sidewall coupled with the first sidewalk the first sidewall and the second sidewall of the first spacer overlap the first isolation.

In some embodiments, a method of manufacturing a semiconductor structure includes providing a substrate having a first region and a second region; forming a patterned mask layer on the substrate; etching the substrate through the patterned mask layer to form a first trench in the first region and a second trench in the second region; deepening the first trench to form a third trench; and forming a first isolation in the third trench and a second isolation in the second trench, wherein a first depth of the first isolation is greater than a second depth of the second isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate comprising a first region and a second region;
a first device disposed in the first region and a second device disposed in the second region, wherein the first device comprises a first source, a first drain, a first gate dielectric, a first gate, and a pair of spacers, the first gate includes a first sidewall and a second sidewall opposite to the first sidewall, the first gate dielectric includes a third sidewall proximal to the first sidewall and a fourth sidewall opposite to the third sidewall, a first spacer of the pair of spacers lines the first sidewall and the third sidewall, and a second spacer of the pair of spacers lines the second sidewall and is separated from the fourth sidewall;
a first isolation disposed in the first region, wherein the first isolation is between the first source and the first drain, the second spacer overlaps the first isolation, the first isolation is separated from the second spacer by the first gate dielectric; and
a second isolation in the first region and adjacent to the first device, wherein a depth of the second isolation is less than a depth of the first isolation.

2. The semiconductor structure of claim 1, wherein a size of the first gate of the first device is greater than a size of a second gate of the second device.

3. The semiconductor structure of claim 1, wherein the second device further comprises a second gate dielectric, and a thickness of the first gate dielectric is greater than a thickness of the second gate dielectric.

4. The semiconductor structure of claim 1, further comprising:
a third isolation disposed in the second region, wherein a depth of the third isolation is less than a depth of the first isolation.

5. The semiconductor structure of claim 4, wherein a first width of the first isolation is greater than a second width of the third isolation.

6. The semiconductor structure of claim 1, wherein an area of the first region is greater than an area of the second region.

7. A semiconductor structure, comprising:
a semiconductor substrate;
a first device disposed in a first region, wherein the first device comprises a first spacer, and a second spacer coupled to the first spacer, and a height of the first spacer is less than a height of the second spacer;
a first isolation in the first region,
wherein the first device overlaps the first isolation, the first spacer has a first sidewall and a second sidewall coupled with the first sidewall, the first sidewall and the second sidewall of the first spacer overlap the first isolation; and
a second isolation in the first region and adjacent to the first device, wherein a depth of the second isolation is less than a depth of the first isolation.

8. The semiconductor structure of claim 7, wherein the first device comprises a first gate dielectric, the first gate dielectric has a first portion over the semiconductor substrate and a second portion over the first isolation, and the second portion is thicker than the first portion.

9. The semiconductor structure of claim 7, further comprising:
a second device disposed in a second region adjacent to the first region, wherein a voltage level of the first device is greater than a voltage level of the second device.

10. The semiconductor structure of claim 9, further comprising:
a third isolation in the second region and adjacent to the second device, wherein a depth of the third isolation is less than a depth of the first isolation.

11. The semiconductor structure of claim 10, wherein a top surface of the first isolation and a top surface of the third isolation are substantially on a same level.

12. A semiconductor structure, comprising:
a first isolation, disposed in a first region of a substrate, wherein the first isolation comprises a first width and a first depth; and
a second isolation, disposed in the first region of the substrate and being adjacent to the first isolation, wherein the second isolation comprises a second width less than the first width, and a second depth less than the first depth;
a first device, disposed over the first region of the substrate and including a first gate dielectric layer, a first spacer and a second spacer, wherein the first device is separated from a vertical projection of the second isolation and overlaps the first isolation, the first gate dielectric layer has a first portion covers the substrate and a second portion covers the first isolation, the first spacer lines a sidewall of the first portion, the second spacer is disposed over the second portion and separated from a sidewall of the second portion, a height of the first spacer is greater than a height of the second spacer, and the first portion is thinner than the second portion.

13. The semiconductor structure of claim 12, wherein the first isolation is between a first source and a first drain of the first device.

14. The semiconductor structure of claim 13, wherein the first source is between the first isolation and the second isolation.

15. The semiconductor structure of claim 12, wherein the first device further includes a first gate electrode disposed over the first gate dielectric layer, and the first spacer and the second spacer are disposed on two opposite sidewalls of the first gate electrode.

16. The semiconductor structure of claim 15, wherein the second spacer overlaps the first isolation, and the first spacer is separated from a vertical projection of the first isolation.

17. The semiconductor structure of claim 12, wherein the semiconductor structure further comprises:
a second device, disposed over a second region of the substrate, wherein the second region is adjacent to the first region; and
a third isolation, disposed in the second region of the substrate, wherein the third isolation has a depth less than the first depth of the first isolation.

18. The semiconductor structure of claim 17, wherein the second device comprises a second gate dielectric layer and a second gate electrode disposed over the second gate dielectric layer, and a thickness of the first gate dielectric layer is greater than a thickness of the second gate dielectric layer.

19. The semiconductor structure of claim 8, wherein the first gate dielectric layer is free from overlapping a drain of the first device.

20. The semiconductor structure of claim 17, wherein the depth of the third isolation is less than the depth of the depth of the second isolation.

* * * * *